(12) United States Patent
Shin et al.

(10) Patent No.: US 11,686,766 B2
(45) Date of Patent: Jun. 27, 2023

(54) BUILT-IN SELF-TEST CIRCUIT AND TEMPERATURE MEASUREMENT CIRCUIT INCLUDING THE SAME

(71) Applicant: SAMSUNG ELECTRONICS CO., LTD., Suwon-si (KR)

(72) Inventors: Junhee Shin, Yongin-si (KR); Jooseong Kim, Seoul (KR); Yongjin Lee, Goyang-si (KR); Michael Choi, Seoul (KR); Kwangho Kim, Yongin-si (KR); Sangho Kim, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 385 days.

(21) Appl. No.: 16/940,809

(22) Filed: Jul. 28, 2020

(65) Prior Publication Data

US 2021/0199719 A1 Jul. 1, 2021

(30) Foreign Application Priority Data

Dec. 27, 2019 (KR) ........................ 10-2019-0175903

(51) Int. Cl.
*G01R 31/317* (2006.01)
*G01R 31/28* (2006.01)
(Continued)

(52) U.S. Cl.
CPC ... *G01R 31/31724* (2013.01); *G01R 31/2874* (2013.01); *G01R 31/3004* (2013.01);
(Continued)

(58) Field of Classification Search
CPC .......... G01R 31/31724; G01R 31/2874; G01R 31/3004; G01R 31/3167; G01R 31/31924;
(Continued)

(56) References Cited

U.S. PATENT DOCUMENTS

| | | |
|---|---|---|
| 7,978,556 B2 | 7/2011 | Macerola et al. |
| 10,209,145 B2 | 2/2019 | You et al. |

(Continued)

FOREIGN PATENT DOCUMENTS

| | | |
|---|---|---|
| JP | 1994-0031343 | 2/1994 |
| JP | 2006-003198 | 1/2006 |

(Continued)

*Primary Examiner* — James C Kerveros
(74) *Attorney, Agent, or Firm* — Fish & Richardson P.C.

(57) ABSTRACT

A temperature measurement circuit includes a band-gap reference circuit configured to generate a band-gap reference voltage that is fixed regardless of an operation temperature, a reference voltage generator circuit configured to generate a measurement reference voltage by adjusting the band-gap reference voltage, a sensing circuit configured to generate a temperature-variant voltage based on a bias current, where the temperature-variant voltage is varied depending on the operation temperature, an analog-digital converter circuit configured to generate a first digital code indicating the operation temperature based on the measurement reference voltage and the temperature-variant voltage, and an analog built-in self-test (BIST) circuit configured to generate a plurality of flag signals indicating whether each of the band-gap reference voltage, the measurement reference voltage, and a bias voltage corresponding to the bias current is included in a predetermined range.

20 Claims, 26 Drawing Sheets

(51) Int. Cl.
*G01R 31/3167* (2006.01)
*H03K 19/017* (2006.01)
*G01R 31/30* (2006.01)
*G01R 31/327* (2006.01)
*G01R 31/319* (2006.01)

(52) U.S. Cl.
CPC ... *G01R 31/3167* (2013.01); *G01R 31/31924* (2013.01); *G01R 31/3274* (2013.01); *H03K 19/01721* (2013.01)

(58) Field of Classification Search
CPC ............ G01R 31/3274; G01R 31/2829; G01R 31/3187; G01R 31/316; G01R 31/318544; G01R 31/318566; H03K 19/01721; G01K 7/01; G01K 15/007
USPC ........................................................ 714/733
See application file for complete search history.

(56) References Cited

U.S. PATENT DOCUMENTS

| | | | |
|---|---|---|---|
| 2013/0073240 A1* | 3/2013 | Kameyama | G01K 15/00 702/65 |
| 2017/0023966 A1* | 1/2017 | Kim | G01K 7/01 |
| 2018/0156675 A1 | 6/2018 | Kumahara et al. | |
| 2019/0155323 A1* | 5/2019 | Kim | G05F 3/267 |
| 2019/0178938 A1* | 6/2019 | Jin | G01R 31/3167 |
| 2021/0088389 A1* | 3/2021 | Ma | G01K 7/01 |

FOREIGN PATENT DOCUMENTS

| | | |
|---|---|---|
| JP | 4573096 | 8/2010 |
| KR | 10-2004-0001638 | 1/2004 |

\* cited by examiner

BUILT-IN SELF-TEST CIRCUIT AND TEMPERATURE MEASUREMENT CIRCUIT INCLUDING THE SAME

CROSS-REFERENCE TO RELATED APPLICATION

This U.S. non-provisional application claims priority under 35 U.S.C. § 119 to Korean Patent Application No. 10-2019-0175903, filed on Dec. 27, 2019 in the Korean Intellectual Property Office (KIPO), the disclosure of which is incorporated by reference herein in its entirety.

TECHNICAL FIELD

Exemplary embodiments of the inventive concept relate generally to semiconductor integrated circuits, and more particularly, to a built-in self-test (BIST) circuit and a temperature measurement circuit including the BIST circuit.

DISCUSSION OF RELATED ART

An operation temperature may be monitored and measured to enhance performance of a semiconductor integrated circuit. For example, based on the measured operation temperature, a power level of an electronic device may be controlled, a refresh period of a memory device may be controlled, damage of a circuit may be prevented, and so on. Heat management becomes more important as operation speed and performance levels are increased. On-chip temperature sensors that are integrated with integrated circuits in the same semiconductor die may be used to detect temperatures of various junctions of the integrated circuits. If the on-chip temperature sensors are out of order, the performance of the semiconductor integrated circuit may be degraded or the semiconductor integrated circuit may be damaged due to wrong information on the operation temperature. Particularly, the wrong temperature information of a semiconductor integrated circuit used in a vehicle may directly impact the life of the driver of the vehicle.

SUMMARY

According to an exemplary embodiment of the inventive concept, a temperature measurement circuit includes a band-gap reference circuit configured to generate a band-gap reference voltage that is fixed regardless of an operation temperature, a reference voltage generator circuit configured to generate a measurement reference voltage by adjusting the band-gap reference voltage, a sensing circuit configured to generate a temperature-variant voltage based on a bias current, where the temperature-variant voltage is varied depending on the operation temperature, an analog-digital converter circuit configured to generate a first digital code indicating the operation temperature based on the measurement reference voltage and the temperature-variant voltage, and an analog built-in self-test (BIST) circuit configured to generate a plurality of flag signals indicating whether each of the band-gap reference voltage, the measurement reference voltage, and a bias voltage corresponding to the bias current is included in a predetermined range.

According to an exemplary embodiment of the inventive concept, a temperature measurement circuit includes a temperature detection circuit and an analog built-in self-test (BIST) circuit. The temperature detection circuit includes an analog circuit configured to generate a measurement reference voltage that is fixed regardless of an operation temperature and a temperature-variant voltage that is varied depending on the operation temperature, and an analog-digital converter circuit configured to generate a digital code indicating the operation temperature based on the measurement reference voltage and the temperature-variant voltage. The analog BIST circuit generates a plurality flag signals indicating whether each of a plurality of voltages of the analog circuit is included in a predetermined range.

According to an exemplary embodiment of the inventive concept, a built-in self-test (BIST) circuit, configured to monitor a temperature detection circuit including an analog circuit and an analog-digital converter circuit, includes an analog BIST circuit configured to generate a plurality of flag signals indicating whether each of a plurality of monitoring voltages of the analog circuit is included in a predetermined range, and a digital BIST circuit configured to apply a test signal to the analog-digital converter circuit in a test mode to generate a plurality of alarm signals indicating whether the analog-digital converter circuit operates normally.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
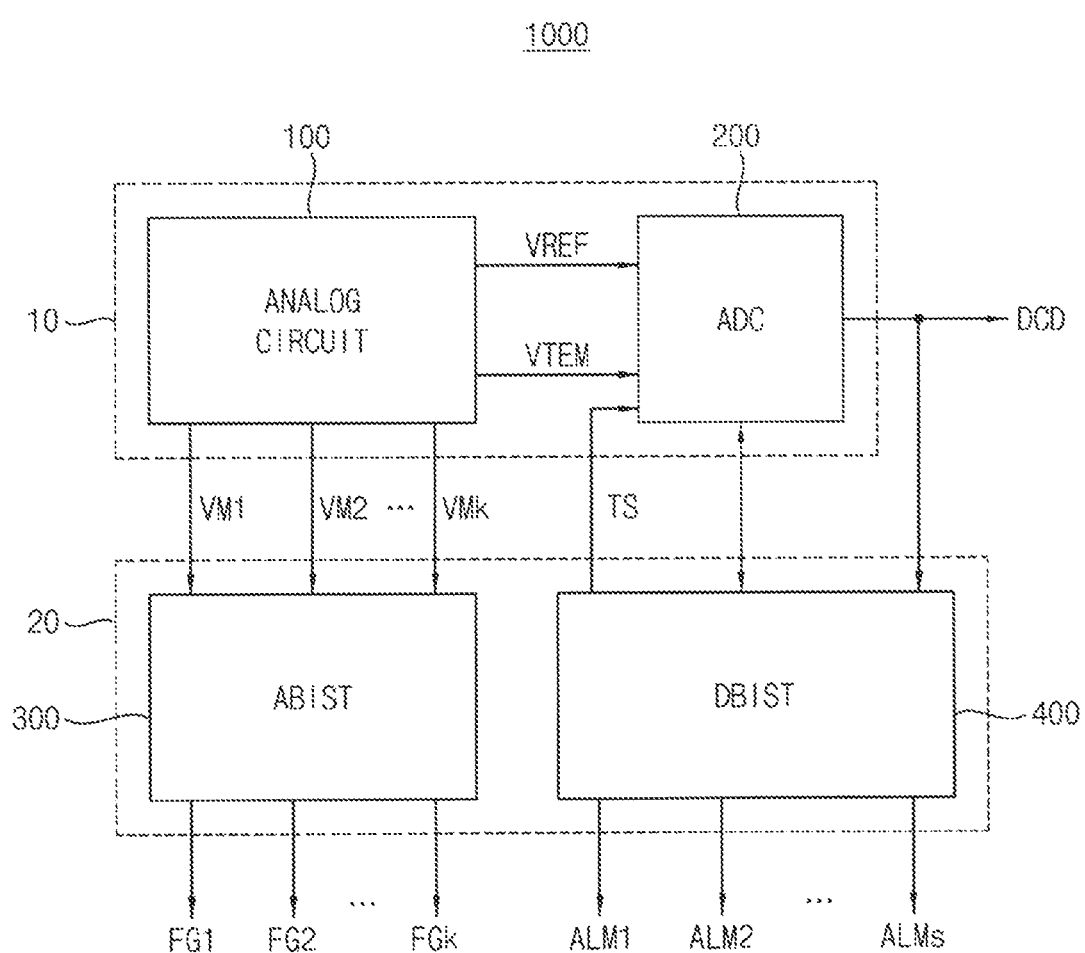
FIG. 1 is a diagram illustrating a temperature measurement circuit according to an exemplary embodiment of the inventive concept.

Exemplary embodiments of the inventive concept provide a built-in self-test (BIST) circuit capable of efficiently monitoring a temperature detection circuit and a temperature measurement circuit including the BIST circuit.

Exemplary embodiments of the inventive concept will be described more fully hereinafter with reference to the accompanying drawings. Like reference numerals may refer to like elements throughout this application.

FIG. 1 is a diagram illustrating a temperature measurement circuit according to an exemplary embodiment of the inventive concept.

Referring to FIG. 1, a temperature measurement circuit 1000 may include a temperature detection circuit 10 and a built-in self-test (BIST) circuit 20. The temperature detection circuit 10 and the BIST circuit 20 may be integrated in the same semiconductor die as will be described below with reference to FIG. 32, and in this case the temperature measurement circuit 1000 may be referred to as an on-chip temperature sensor.

The temperature detection circuit 10 may include an analog circuit 100 and an analog-digital converter ADC 200.

The analog circuit 100 may generate a measurement reference voltage VREF that is fixed regardless of an operation temperature and a temperature-variant voltage VTEM that is varied depending on the operation temperature. The analog-digital converter 200 may generate a digital code DCD indicating the operation temperature based on the measurement reference voltage VREF and the temperature-variant voltage VTEM. The analog-digital converter 200 may be a circuit.

The BIST circuit 20 may include at least one of an analog BIST circuit ABIST 300 and a digital BIST circuit DBIST 400. In exemplary embodiments of the inventive concept, the BIST circuit 20 may include only the analog BIST circuit 300 and the digital BIST circuit 400 may be omitted. In exemplary embodiments of the inventive concept, the BIST circuit 20 may include only the digital BIST circuit 400 and the analog BIST circuit 300 may be omitted. In exemplary embodiments of the inventive concept, the BIST circuit 20 may include both of the analog BIST circuit 300 and the digital BIST circuit 400.

The analog BIST circuit 300 may generate a plurality of flag signals FG1~FGk indicating whether each of a plurality of monitoring voltages VM1~VMk of the analog circuit 100 is included in a normal range. The normal range may be a predetermined range indicating normal operation of a particular component. The monitoring voltage may indicate a voltage that is used in the analog circuit 100 and/or provided to other components (e.g., the analog-digital converter 200) external to the analog circuit 100. For example, the monitoring voltages VM1~VMk may include at least one of the measurement reference voltage VREF, the temperature-variant voltage VTEM, and a bias voltage VBS as will be described below with reference to FIGS. 6 through 13.

The digital BIST circuit 400 may apply a test signal TS to the analog-digital converter 200 in a test mode to generate a plurality of alarm signals ALM1~ALMs indicating whether the analog-digital converter 200 operates normally. The digital BIST circuit 400 may apply the test signal TS instead of the temperature-variant voltage VTEM in the test mode to receive the digital code DCD for generating the plurality of alarm signals ALM1~ALMs. The plurality of alarm signals ALM1~ALMs will be described below with reference to FIGS. 14 through 31.

As such, the BIST circuit and the temperature measurement circuit according to exemplary embodiments of the inventive concept may efficiently diagnose failure of the temperature measurement circuit by monitoring whether various voltages are in normal ranges using the BIST circuit. In addition, the BIST circuit and the temperature measurement circuit according to exemplary embodiments of the inventive concept may efficiently diagnose the analog-digital converter included in the temperature measurement circuit by performing various tests using the digital BIST circuit.

Figure 2:
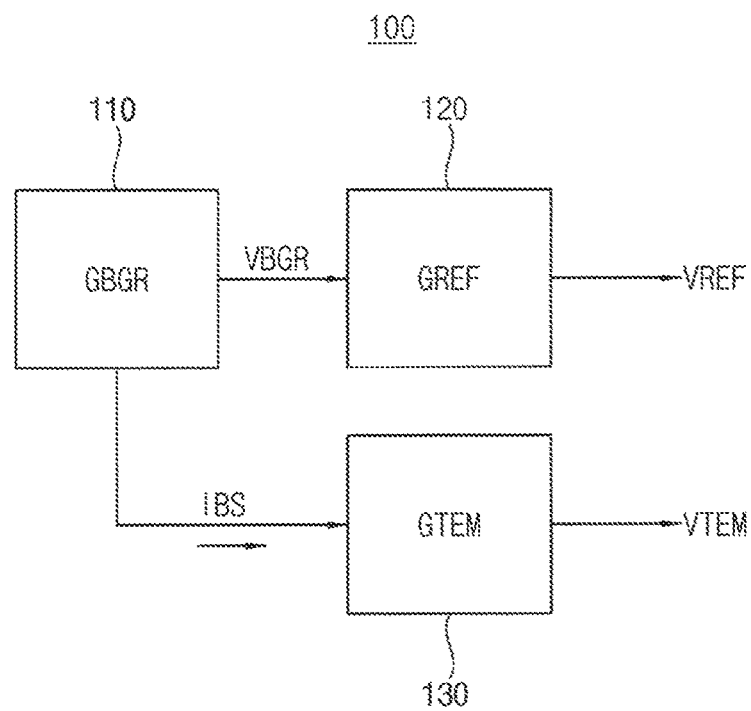
FIG. 2 is a block diagram illustrating an analog circuit included in the temperature measurement circuit of FIG. 1 according to an exemplary embodiment of the inventive concept.

FIG. 2 is a block diagram illustrating an analog circuit included in the temperature measurement circuit of FIG. 1 according to an exemplary embodiment of the inventive concept.

Referring to FIG. 2, the analog circuit 100 may include a band-gap reference circuit GBGR 110, a reference voltage generator GREF 120, and a sensing circuit GTEM 130. The reference voltage generator 120 may be a circuit.

The band-gap reference circuit 110 may generate a band-gap reference voltage VBGR that is fixed regardless of an operation temperature. The reference voltage generator 120 may generate the measurement reference voltage VREF by adjusting the band-gap reference voltage VBGR. Similar to the band-gap reference voltage VBGR, the measurement reference voltage VREF may be fixed regardless of the operation temperature. The sensing circuit 130 may generate the temperature-variant voltage VTEM based on a bias current IBS such that the temperature-variant voltage VTEM may be varied depending on the operation temperature.

FIG. 2 illustrates that the bias current IBS is provide from the band-gap reference circuit 110, but the inventive concept is not limited thereto. According to exemplary embodiments of the inventive concept, the bias current IBS may be generated in the sensing circuit 130.

Hereinafter, with reference to FIGS. 3 through 5, exemplary embodiments of the band-gap reference circuit 110, the reference voltage generator 120, and the sensing circuit 130 will be described. However, the inventive concept is not limited to the configuration of FIGS. 3 through 5, and the configuration of the analog circuit 100 may be implemented differently.

Figure 3:
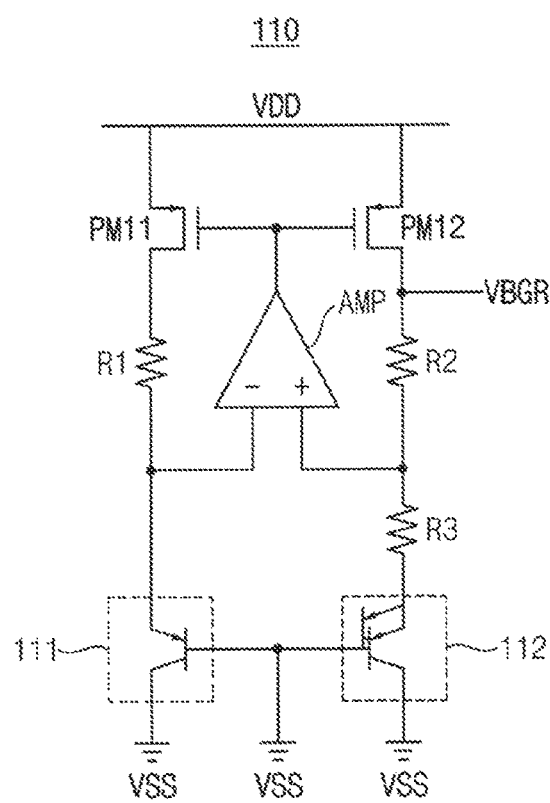
FIG. 3 is a circuit diagram illustrating a band-gap reference circuit included in the analog circuit of FIG. 2 according to an exemplary embodiment of the inventive concept.

FIG. 3 is a circuit diagram illustrating a band-gap reference circuit included in the analog circuit of FIG. 2 according to an exemplary embodiment of the inventive concept.

Referring to FIG. 3, the band-gap reference circuit 110 may include a first p-channel metal oxide semiconductor (PMOS) transistor PM11, a second PMOS transistor PM12, a first resistor R1, a second resistor R2, a third resistor R3, a feedback amplifier AMP, a first sensing unit 111, and a second sensing unit 112, which are connected between a power supply voltage VDD and a ground voltage VSS as illustrated in FIG. 3.

The first sensing unit 111 may be implemented with a signal bipolar junction transistor (BJT) and the second sensing unit 112 may be implemented with a plurality of BJTs. Using such band-gap reference circuits, the band-gap reference voltage VBGR and/or a band-gap reference current, which are fixed regardless of the operation temperature, may be provided.

The emitter voltage of the second sensing unit 112 is inversely proportional to the operation temperature. A voltage across the third resistor R3 and a current flowing through the third resistor R3 are proportional to the operation temperature. As a result, the band-gap reference voltage VBGR may be fixed regardless of the operation temperature by the proportional and inversely-proportional characteristics of the circuit. For example, the band-gap reference voltage VBGR may be provided at a connection node of the second PMOS transistor PM12 and the second resistor R2.

Figure 4:
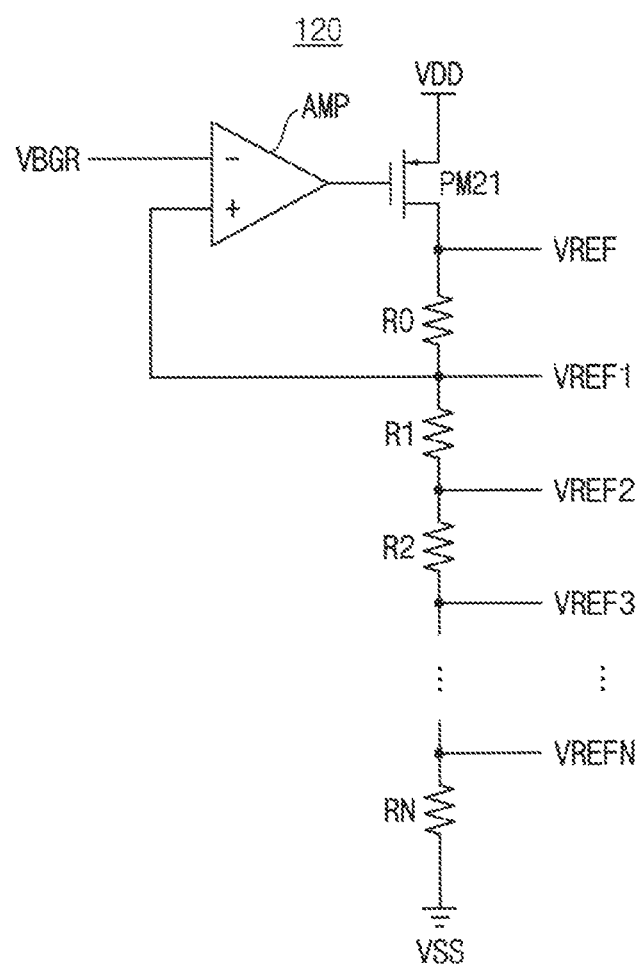
FIG. 4 is a circuit diagram illustrating a reference voltage generator included in the analog circuit of FIG. 2 according to an exemplary embodiment of the inventive concept.

FIG. 4 is a circuit diagram illustrating a reference voltage generator included in the analog circuit of FIG. 2 according to an exemplary embodiment of the inventive concept.

Referring to FIG. 4, the reference voltage generator 120 may include an amplifier AMP, a PMOS transistor PM21, and a plurality of division resistors R0~RN, which are connected between the power supply voltage VDD and the ground voltage VSS as illustrated in FIG. 4. The measurement reference voltage VREF and a plurality of division voltages VREF1~VREFN may be determined according to ratios of the division resistors R0~RN. The amplifier AMP, the PMOS transistor PM21, and the resistor R0 form a feedback loop, and thus the division voltage VREF1 may converge to the band-gap reference voltage VBGR. The band-gap reference voltage VBGR may be fixed, and accordingly, the measurement reference voltage VREF proportional to the band-gap reference voltage VBGR may be fixed regardless of the operation temperature.

Figure 5:
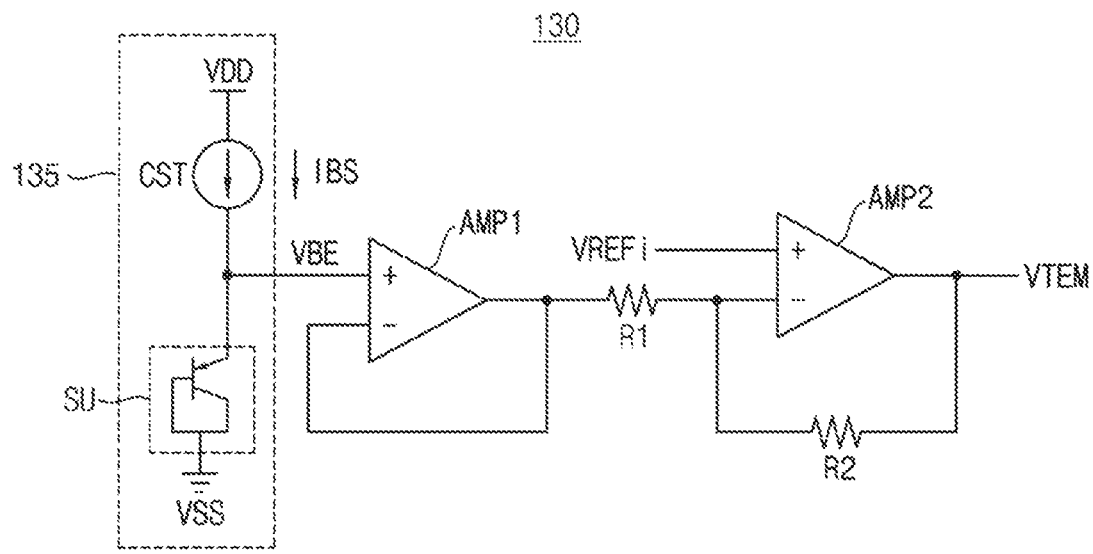
FIG. 5 is a circuit diagram illustrating a sensing circuit include in the analog circuit of FIG. 2 according to an exemplary embodiment of the inventive concept.

FIG. 5 is a circuit diagram illustrating a sensing circuit include in the analog circuit of FIG. 2 according to an exemplary embodiment of the inventive concept.

Referring to FIG. 5, the sensing circuit 130 may include a current-voltage converter 135, a first amplifier AMP1, a second amplifier AMP2, a first resistor R1, and a second resistor R2.

The current-voltage converter 135 may include a current source CST and a sensing unit SU connected between the power supply voltage VDD and the ground voltage VSS. The sensing unit SU may be implemented with a BJT. A sensing voltage VBE corresponding to the emitter voltage of the BJT may be inversely proportional to the operation temperature. The positive terminal of the first amplifier AMP1 may receive the sensing voltage VBE, and the negative terminal may be connected to the output terminal such that the first amplifier AMP1 may form a unity-gain amplifier. The output terminal of the first amplifier AMP1 may be connected through the first resistor R1 to the negative terminal of the second amplifier AMP2. The second amplifier AMP2 may receive a reference voltage VREFi through the positive terminal. The output terminal of the second amplifier AMP2 may be connected through the second resistor R2 to the negative terminal of the second amplifier AMP2.

Through such configuration, the sensing voltage VBE inversely-proportional to the operation temperature may be inverted and amplified to generate the temperature-variant voltage VTEM that is increased as the operation temperature is increased.

As described with reference to FIGS. 3 through 5, the measurement reference voltage VREF that is fixed regardless of the operation temperature and the temperature-variant voltage VTEM that is varied depending on the operation temperature may be provided to the analog-digital converter 200 in FIG. 1. The analog-digital converter 200 may generate the digital code DCD indicating the operation temperature based on the measurement reference voltage VREF and the temperature-variant voltage VTEM.

Figure 6:
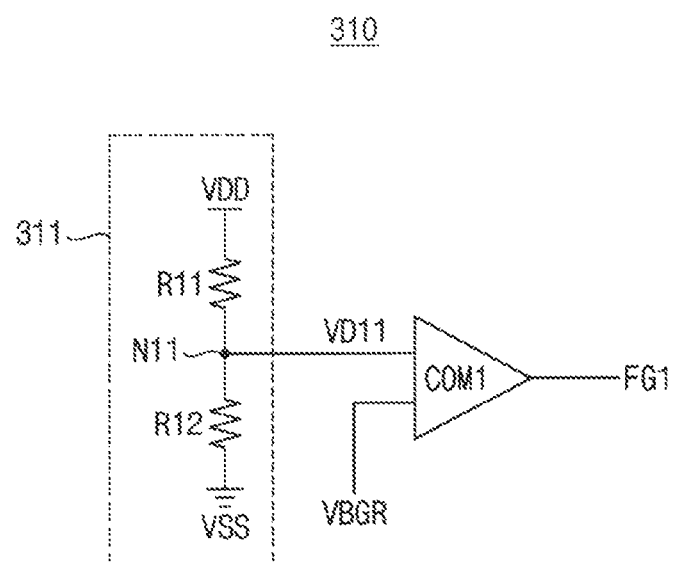
FIG. 6 is a circuit diagram illustrating a band-gap reference voltage monitor included in an analog BIST circuit according to an exemplary embodiment of the inventive concept.
Figure 7:
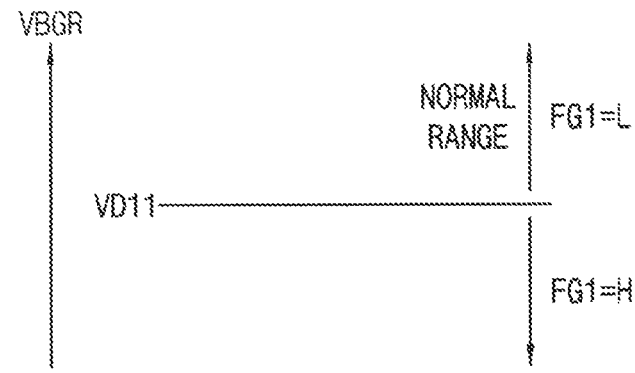
FIG. 7 is a diagram for describing an operation of the band-gap reference voltage monitor of FIG. 6 according to an exemplary embodiment of the inventive concept.

FIG. 6 is a circuit diagram illustrating a band-gap reference voltage monitor included in an analog BIST circuit according to an exemplary embodiment of the inventive concept, and FIG. 7 is a diagram for describing an operation of the band-gap reference voltage monitor of FIG. 6 according to an exemplary embodiment of the inventive concept.

Referring to FIG. 6, a band-gap reference voltage monitor 310 may include a power supply voltage divider 311 and a comparator COM1. The power supply voltage divider 311 and the comparator COM1 may be circuits.

The power supply voltage divider 311 may generate a power division voltage VD11 corresponding a lowest limit level of the band-gap reference voltage VBGR by dividing the power supply voltage VDD.

In exemplary embodiments of the inventive concept, as illustrated in FIG. 6, the power supply voltage divide 311 may include a first division resistor R11 connected between the power supply voltage VDD and a division node N11, and a second division resistor R12 connected between the division node N11 and the ground voltage VSS. The power division voltage VD11 may be provided at the division node N11, and the power division voltage VD11 corresponds to the lowest limit level to set the normal range of the band-gap reference voltage VBGR. In other words, it is determined that the band-gap reference voltage VBGR deviates from the normal range if the band-gap reference voltage VBGR decreases excessively. The lowest limit level of the band-gap reference voltage VBGR or the power division voltage VD11 may be controlled properly by adjusting the resistance ratio of the first division resistor R11 and the second division resistor R12.

Referring to FIGS. 6 and 7, the comparator COM1 may generate a band-gap flag signal FG1 by comparing the band-gap reference voltage VBGR with the power division voltage VD11 such that the band-gap flag signal FG1 may be activated when the band-gap reference voltage VBGR is lower than the lowest limit level of the band-gap reference voltage VBGR.

For example, the band-gap flag signal FG1 may be deactivated in a first logic level (e.g., a logic low level L) when the band-gap reference voltage VBGR is higher than the lowest limit level, and the band-gap flag signal FG1 may be activated in a second logic level (e.g., a logic high level H) when the band-gap reference voltage VBGR is lower than the lowest limit level.

Figure 8:
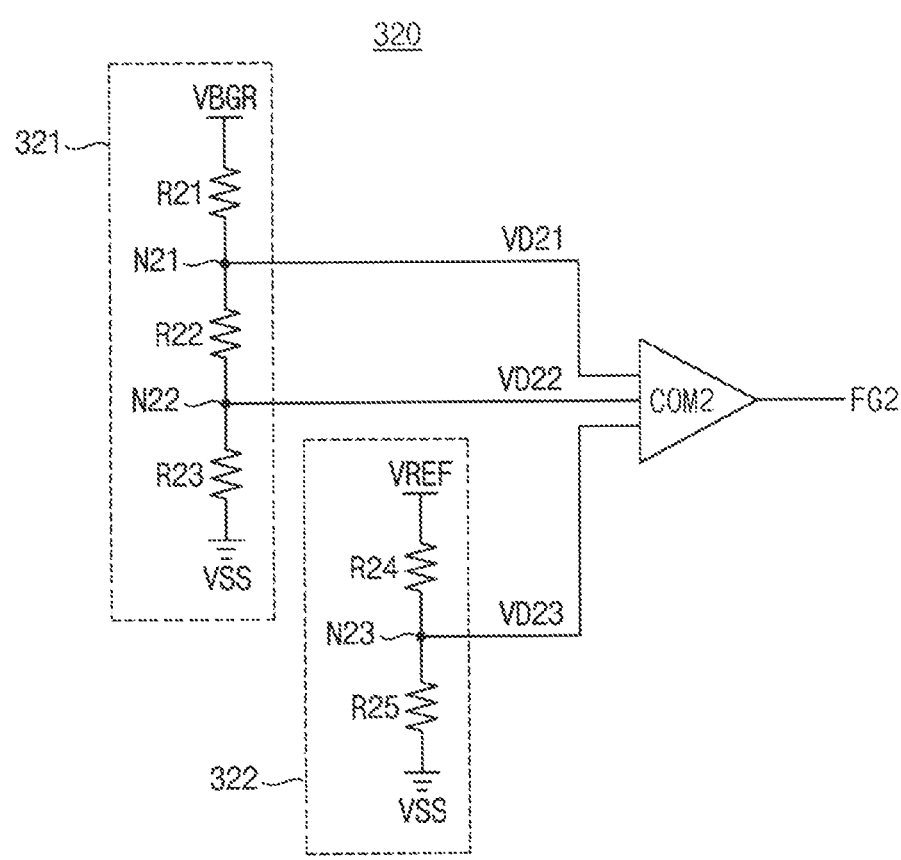
FIG. 8 is a circuit diagram illustrating a measurement reference voltage monitor included in an analog BIST circuit according to an exemplary embodiment of the inventive concept.
Figure 9:
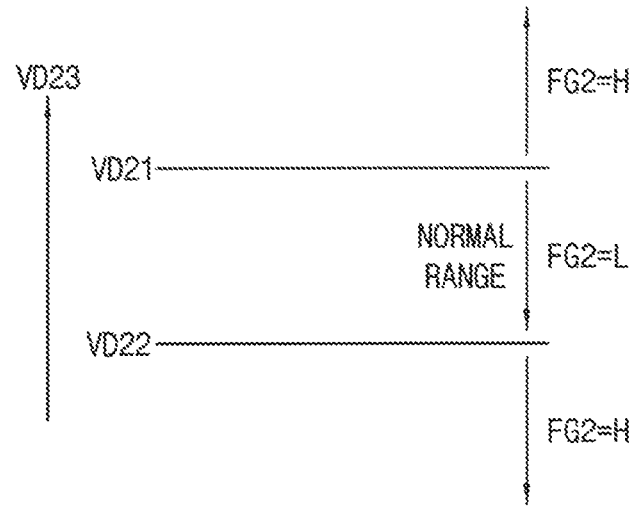
FIG. 9 is a diagram for describing an operation of the measurement reference voltage monitor of FIG. 8 according to an exemplary embodiment of the inventive concept.

FIG. 8 is a circuit diagram illustrating a measurement reference voltage monitor included in an analog BIST circuit according to exemplary embodiments of the inventive concept, and FIG. 9 is a diagram for describing an operation of the measurement reference voltage monitor of FIG. 8 according to an exemplary embodiment of the inventive concept.

Referring to FIG. 8, a measurement reference voltage monitor 320 may include a band-gap reference voltage divider 321, a measurement reference voltage divider 322, and a comparator COM2. The band-gap reference voltage divider 321, the measurement reference voltage divider 322, and the comparator COM2 may be circuits.

The band-gap reference voltage divider 321 may generate a first band-gap division voltage VD21 corresponding a highest limit level of the measurement reference voltage VREF and a second band-gap division voltage VD22 corresponding to a lowest limit level of the measurement reference voltage VREF by dividing the band-gap reference voltage VBGR.

In exemplary embodiments of the inventive concept, as illustrated in FIG. 8, the band-gap reference voltage divider 321 may include a first division resistor R21 connected between the power supply voltage VDD and a first division node N21, a second division resistor R22 connected between the first division node N21 and a second division node N22, and a third division resistor R23 connected between the second division node N22 and the ground voltage VSS.

The first band-gap division voltage VD21 may be provided at the first division node N21, and the first band-gap division voltage V21 may correspond to a highest limit level to set the normal range of the measurement reference voltage VREF. The second band-gap division voltage VD22 may be provided at the second division node N22, and the second band-gap division voltage V22 may correspond to a lowest limit level to set the normal range of the measurement reference voltage VREF. In other words, it is determined that the measurement reference voltage VREF deviates from the normal range if the band-gap reference voltage VBGR increases or decreases excessively. The highest and lowest limit levels of the measurement reference voltage VREF, or the first and second band-gap division voltages VD21 and VD22, may be controlled properly by adjusting the resistance ratios of the first division resistor R21, the second division resistor R22, and the third division resistor R23.

The measurement reference voltage divider 322 may generate a measurement division voltage VD23 by dividing the measurement reference voltage VREF.

In exemplary embodiments of the inventive concept, as illustrated in FIG. 8, the measurement reference voltage divider 322 may include a fourth division resistor R24 connected between the measurement reference voltage VREF and a third division node N23, and a fifth division resistor R25 connected between the third division node N23 and the ground voltage VSS. The measurement division voltage VD23 may be provided at the third division node N23. The measurement division voltage VD23 may be controlled properly by adjusting the resistance ratio of the fourth division resistor R24 and the fifth division resistor R25.

Referring to FIGS. 8 and 9, the comparator COM2 may generate a reference voltage flag signal FG2 by comparing the measurement division voltage VD23 with the first band-gap division voltage VD21 and the second band-gap division voltage VD22 such that the reference voltage flag signal FG2 may be activated when the measurement reference voltage VREF is higher than the highest limit level of the measurement reference voltage VREF or lower than the lowest limit level of the measurement reference voltage VREF.

For example, the reference voltage flag signal FG2 may be deactivated to a first logic level (e.g., a logic low level L) when the measurement reference voltage VREF is lower than the highest limit level and higher than the lowest limit level, and the reference voltage flag signal FG2 may be activated to a second logic level (e.g., a logic high level H) when the measurement reference voltage VREF is higher than the highest limit level or lower than the lowest limit level.

Figure 10:
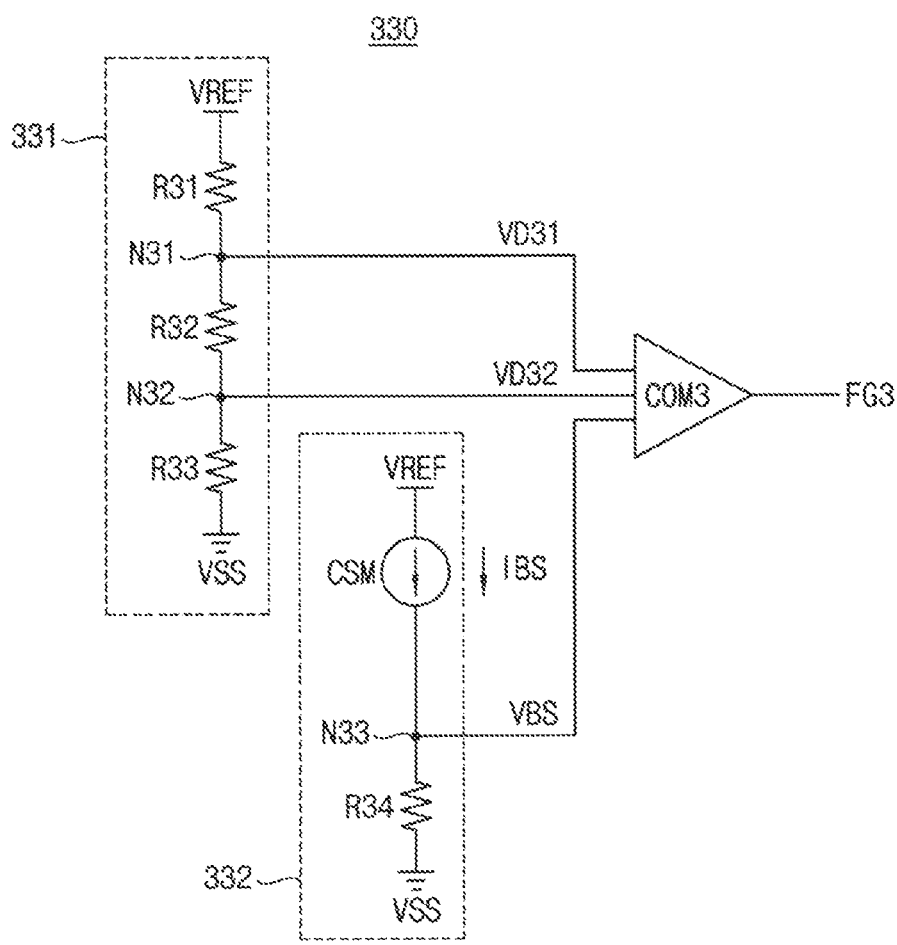
FIG. 10 is a circuit diagram illustrating a bias voltage monitor included in an analog BIST circuit according to an exemplary embodiment of the inventive concept.
Figure 11:
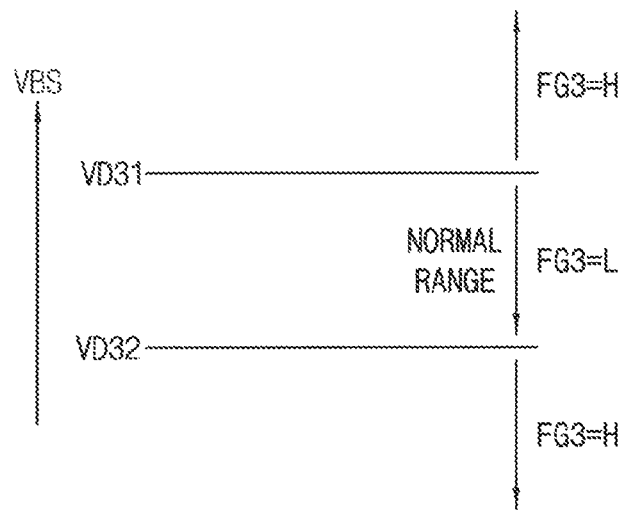
FIG. 11 is a diagram for describing an operation of the bias voltage monitor of FIG. 10 according to an exemplary embodiment of the inventive concept.

FIG. 10 is a circuit diagram illustrating a bias voltage monitor included in an analog BIST circuit according to an exemplary embodiment of the inventive concept, and FIG. 11 is a diagram for describing an operation of the bias voltage monitor of FIG. 10 according to an exemplary embodiment of the inventive concept.

Referring to FIG. 10, a bias voltage monitor 330 may include a measurement reference voltage divider 331, a current-voltage converter 332, and a comparator COM3. The measurement reference voltage divider 331, the current-voltage converter 332, and the comparator COM3 may be circuits.

The measurement reference voltage divider 331 may generate a first measurement reference division voltage VD31 corresponding a highest limit level of the bias voltage VBS and a second measurement reference division voltage VD32 corresponding to a lowest limit level of the bias voltage VBS by dividing the measurement reference voltage VREF.

In exemplary embodiments of the inventive concept, as illustrated in FIG. 10, the bias voltage divider 331 may include a first division resistor R31 connected between the measurement reference voltage VREF and a first division node N31, a second division resistor R32 connected between the first division node N31 and a second division node N32, and a third division resistor R33 connected between the second division node N32 and the ground voltage VSS.

The first measurement reference division voltage VD31 may be provided at the first division node N31, and the measurement reference division voltage VD31 may correspond to a highest limit level to set the normal range of the bias voltage VBS. The second measurement reference division voltage VD32 may be provided at the second division node N32, and the second measurement reference division voltage VD32 may correspond to a lowest limit level to set the normal range of the bias voltage VBS. In other words, it is determined that the bias voltage VBS deviates from the normal range if the bias voltage VBS increases or decreases excessively. The highest and lowest limit levels of the bias voltage VBS, or the first and second measurement reference division voltages VD31 and VD32, may be controlled properly by adjusting the resistance ratios of the first division resistor R31, the second division resistor R32, and the third division resistor R33.

The current-voltage converter 332 may generate the bias voltage VBS based on the bias current IBS. For example, as illustrated in FIG. 10, the current-voltage converter 332 may include a current source CSM and a resistor R34 connected between the power supply voltage VDD and the ground voltage VSS. In exemplary embodiments of the inventive concept, the current source CSM may be omitted, and in this case the bias current IBS may be provided from the band-gap reference circuit 110 in FIG. 2.

Referring to FIGS. 10 and 11, the comparator COM3 may generate a bias voltage flag signal FG3 by comparing the bias voltage VBS with the first measurement reference division voltage VD31 and the second measurement reference division voltage VD32 such that the bias voltage flag signal FG3 may be activated when the bias voltage VBS is higher than the highest limit level of the bias voltage VBS or lower than the lowest limit level of the bias voltage VBS.

For example, the bias voltage flag signal FG3 may be deactivated in a first logic level (e.g., a logic low level L) when the bias voltage VBS is lower than the highest limit level and higher than the lowest limit level, and the bias voltage flag signal FG3 may be activated in a second logic level (e.g., a logic high level H) when the bias voltage VBS is higher than the highest limit level or lower than the lowest limit level.

Figure 12:
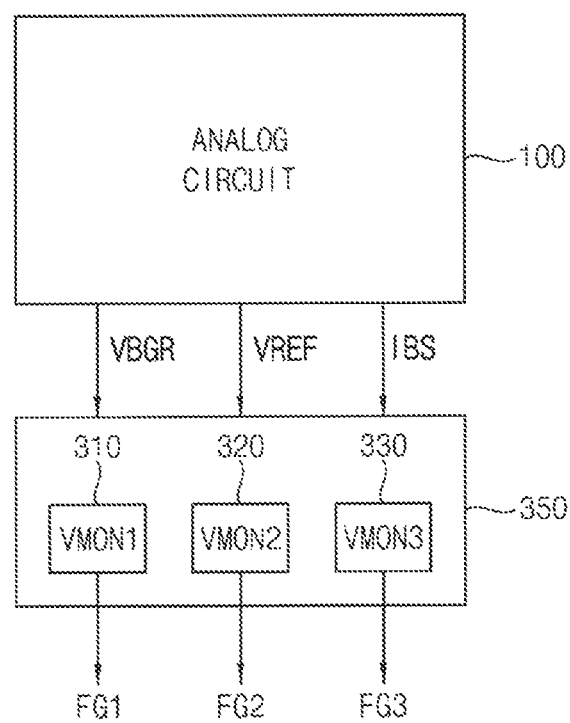
FIG. 12 is a diagram illustrating an analog BIST circuit according to an exemplary embodiment of the inventive concept.

FIG. 12 is a diagram illustrating an analog BIST circuit according to an exemplary embodiment of the inventive concept.

Referring to FIG. 12, an analog BIST circuit 350 may include the band-gap reference voltage monitor VMON1 310, the measurement reference voltage monitor VMON2 320, and the bias voltage monitor VMON3 330. Each of the band-gap reference voltage monitor 310, the measurement reference voltage monitor 320, and the bias voltage monitor 330 may be a circuit. The analog BIST circuit 350 may receive the band-gap reference voltage VBGR and the measurement reference voltage VREF from the analog circuit 100. In addition, the analog BIST circuit 350 may internally generate the bias voltage VBS based on the bias current IBS. According to exemplary embodiments of the inventive concept, the analog BIST circuit 350 may receive the bias current IBS from the analog circuit 100 or internally generate the bias current IBS.

The band-gap reference voltage monitor 310, as described with reference to FIGS. 6 and 7, may generate the band-gap flag signal FG1 based on the band-gap reference voltage VBGR and the power supply voltage VDD such that the band-gap flag signal FG1 may be activated when the band-gap reference voltage VBGR deviates from its normal range.

The measurement reference voltage monitor 320, as described with reference to FIGS. 8 and 9, may generate the reference voltage flag signal FG2 based on the measurement reference voltage VREF and the band-gap reference voltage VBGR such that the reference voltage flag signal FG2 may be activated when the measurement reference voltage VREF deviates from its normal range.

The bias voltage monitor 330, as described with reference to FIGS. 10 and 11, may generate the bias voltage flag signal FG3 based on the bias voltage VBS corresponding to the bias current IBS and the measurement reference voltage VREF, such that the bias voltage flag signal FG3 may be activated when the bias voltage VBS deviates from its normal range.

In other words, each of the monitors 310, 320, and 330 may generate one of the flag signals FG1, FG2, and FG3 by comparing one monitoring voltage with one comparison reference voltage.

As described with reference to FIGS. 6 and 7, the power supply voltage VDD corresponds to the comparison reference voltage and the band-gap reference voltage VBGR corresponds to the monitoring voltage in the case of the band-gap reference voltage monitor 310. As described with reference to FIGS. 8 and 9, the band-gap reference voltage VBGR corresponds to the comparison reference voltage and the measurement reference voltage VREF corresponds to the monitoring voltage in the case of the measurement reference voltage monitor 320. As described with reference to FIGS. 10 and 11, the measurement reference voltage VREF corresponds to the comparison reference voltage and the bias voltage VBS corresponds to the monitoring voltage in the case of the bias voltage monitor 330.

As such, the monitoring voltage for one voltage monitor may be used as the comparison reference voltage for another voltage monitor. As described above, the band-gap reference voltage VBGR corresponding to the monitoring voltage of the band-gap reference voltage monitor 310 may be applied as the comparison reference voltage of the measurement reference voltage monitor 320, and the measurement reference voltage VREF corresponding to the monitoring voltage of the measurement reference voltage monitor 320 may be applied as the comparison reference voltage of the bias voltage monitor 330. In this way, the deviation of the monitoring voltage of the previous voltage monitor may be propagated to the next voltage monitor, and thus, the last voltage monitor may determine the synthetic deviation of the multiple voltage monitors.

According to exemplary embodiments of the inventive concept, the analog BIST circuit may include one or two of the band-gap reference voltage monitor 310, the measurement reference voltage monitor 320, and the bias voltage monitor 330. In addition, the analog BIST circuit according to exemplary embodiments of the inventive concept may include four or more voltage monitors to monitor whether four or more voltages are included in their respective normal ranges.

Figure 13:
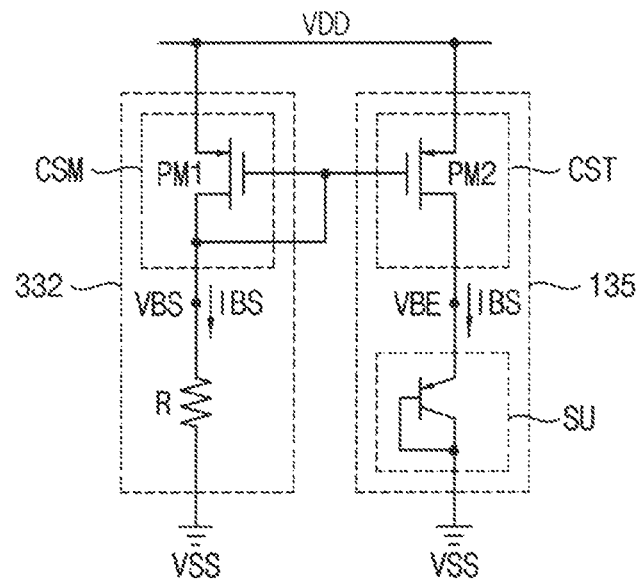
FIG. 13 is a circuit diagram for describing a bias current and a bias voltage of an analog BIST circuit according to an exemplary embodiment of the inventive concept.

FIG. 13 is a circuit diagram for describing a bias current and a bias voltage of an analog BIST circuit according to an exemplary embodiment of the inventive concept.

FIG. 13 illustrates an exemplary embodiment where the current-voltage converter 135 included in the sensing circuit 130 as described with reference to FIG. 5 and the current-voltage converter 332 included in the bias voltage monitor 330 as described with reference to FIG. 10 are implemented as a whole. Descriptions already provided with reference FIGS. 5 and 10 may be omitted.

Referring to FIG. 13, the current-voltage converter 135 of the sensing circuit 130 may include a first current source CST to generate the bias current IBS and the current-voltage converter 332 of the bias voltage monitor 330 may include a second current source CSM to generate the bias current IBS.

The first current source CST and the second current source CSM may include PMOS transistors PM1 and PM2, which form a current mirror. In this case, the criteria for the normal operation of the analog circuit 100 may be properly set by generating the temperature-fixed bias voltage VBS and the temperature-variant sensing voltage VBE using the same bias current IBS.

Figure 14:
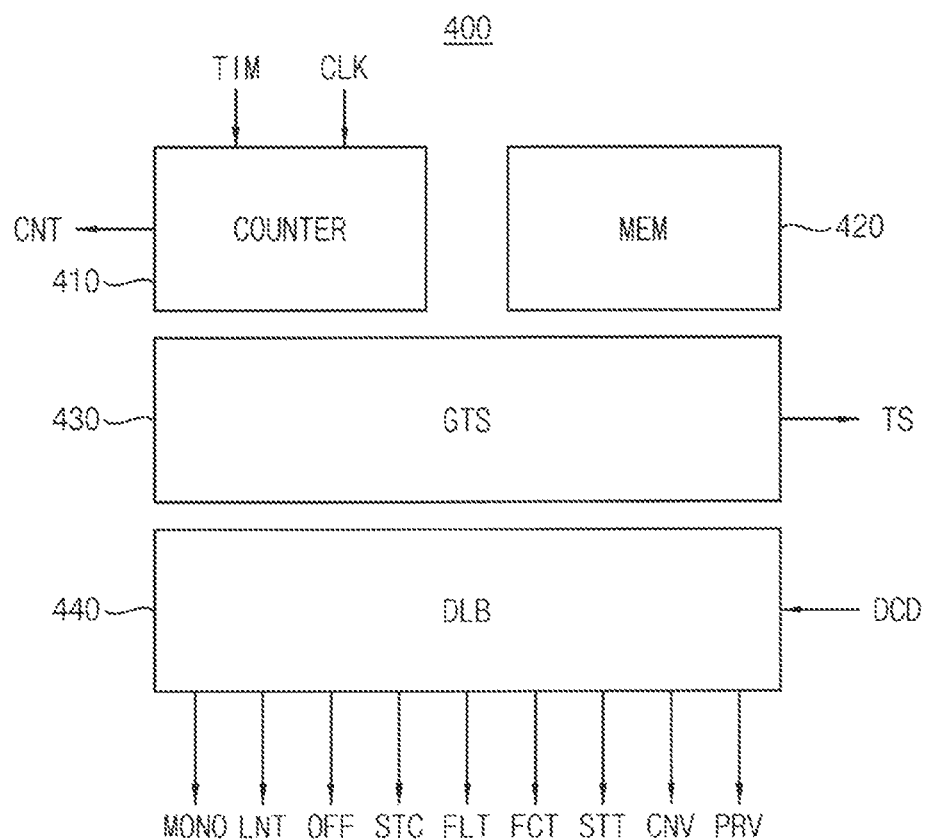
FIG. 14 is a block diagram illustrating a digital BIST circuit according to an exemplary embodiment of the inventive concept.

FIG. 14 is a block diagram illustrating a digital BIST circuit according to an exemplary embodiment of the inventive concept.

Referring to FIG. 14, a digital BIST circuit 400 may include a counter 410, a memory MEM 420, a test signal generator GTS 430, and a digital logic block DLB 440. Elements of the digital BIST circuit 400 may be circuits.

The counter 410 may monitor operation timings of the analog-digital converter 200. The counter 410 may generate a count signal CNT corresponding to the operation timings based on a timing signal TIM and a clock signal CLK. For example, the timing signal TIM may include a scan start signal SOS, a conversion start signal SOC, a conversion end signal EOC, etc., as will be described below with reference to FIGS. 24 through 25.

The memory 420 may store information for the operation of the digital BIST circuit 400 and information on test results obtained by the digital BIST circuit 400.

The test signal generator 430 may generate a test signal TS for various tests. In a test mode, the test signal TS may be applied to the analog-digital converter 200 instead of the temperature-variant voltage VTEM.

The digital logic block 440 may receive the digital code DCD, control overall operations of the digital BIST circuit 400, and generate a plurality of alarm signals MONO, LNT, OFF, STC, FLT, FCT, STT, CNV, and PRV according to the test results.

Figure 15:
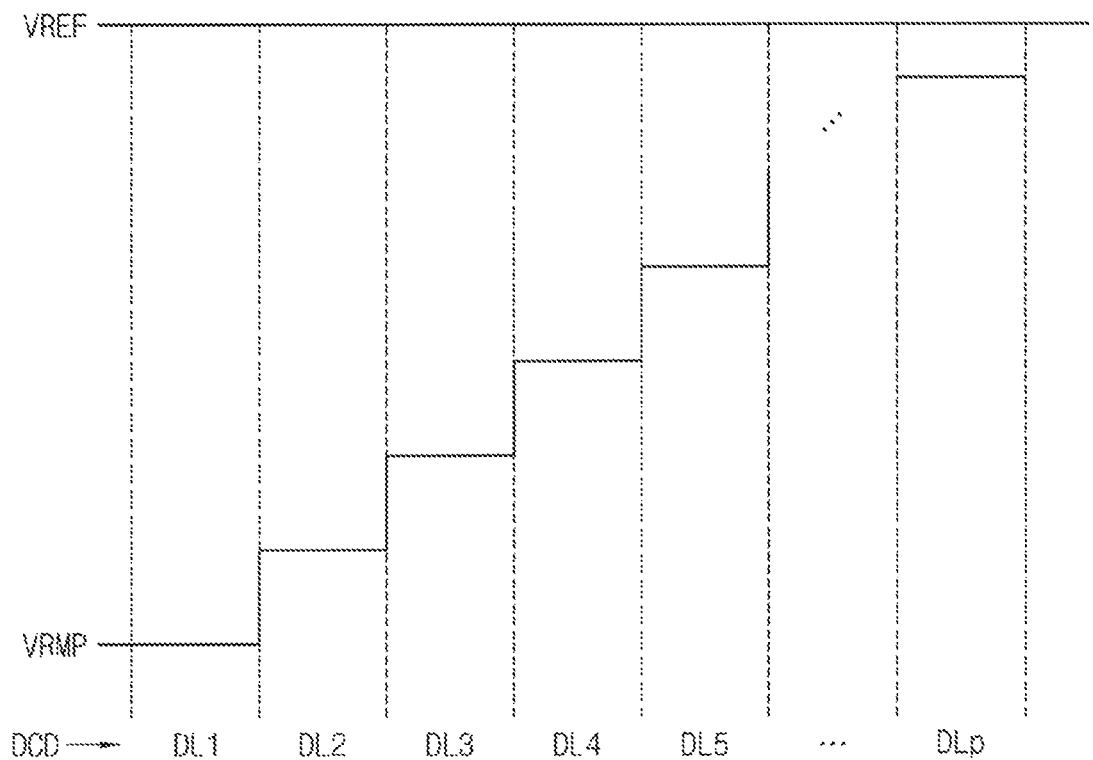
FIGS. 15 and 16 are diagrams for describing an example operation of the digital BIST circuit of FIG. 14 according to an exemplary embodiment of the inventive concept.
Figure 16:
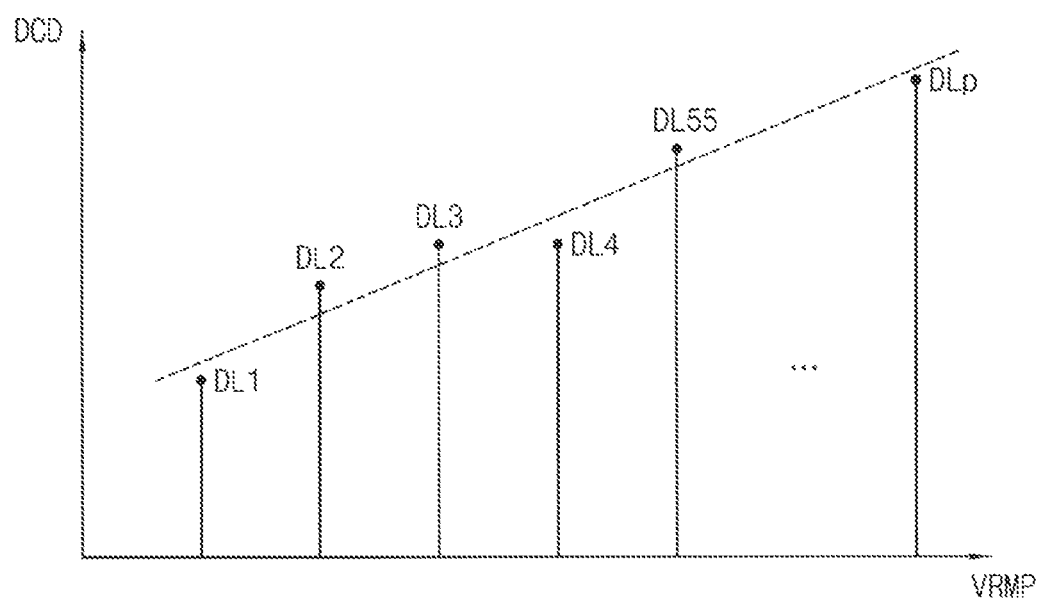

FIGS. 15 and 16 are diagrams for describing an example operation of the digital BIST circuit of FIG. 14 according to an exemplary embodiment of the inventive concept.

Referring to FIGS. 14 and 15, the test signal generator 420 may generate a ramp voltage VRMP having a voltage level sequentially increasing or sequentially decreasing, and apply the ramp voltage VRMP as the test signal TS to the analog-digital converter 200 in the test mode. FIG. 15 illustrates a non-limiting example where the ramp voltage VRMP increases sequentially.

The digital logic block 440 may test whether the analog-digital converter 200 operates normally, based on a plurality of values DL1~DLp that are obtained by applying the ramp voltage VRMP instead of the temperature-variant voltage VTEM to the analog-digital converter 200 in the test mode. For example, the analog-digital converter 200, as illustrated in FIG. 15, may be implemented such that the values DL1~DLp may be increased as the temperature-variant voltage VTEM or the ramp voltage VRMP is increased. According to exemplary embodiments of the inventive concept, the analog-digital converter 200 may be implemented such that the values DL1~DLp may be decreased as the temperature-variant voltage VTEM or the ramp voltage VRMP is increased.

FIG. 16 illustrates monotony and linearity with respect to the example values DL1~DLp of the digital code DCD. The analog-digital converter 200 is required to generate the digital code DCD having a value that is monotonously and linearly proportional to the operation temperature. By testing such monotony and linearity, it is determined whether the analog-digital converter 200 operates normally.

Hereinafter, it is assumed that an alarm signal is activated in a logic high level H and deactivated in a logic low level L, but the inventive concept is not limited thereto.

Figure 17:
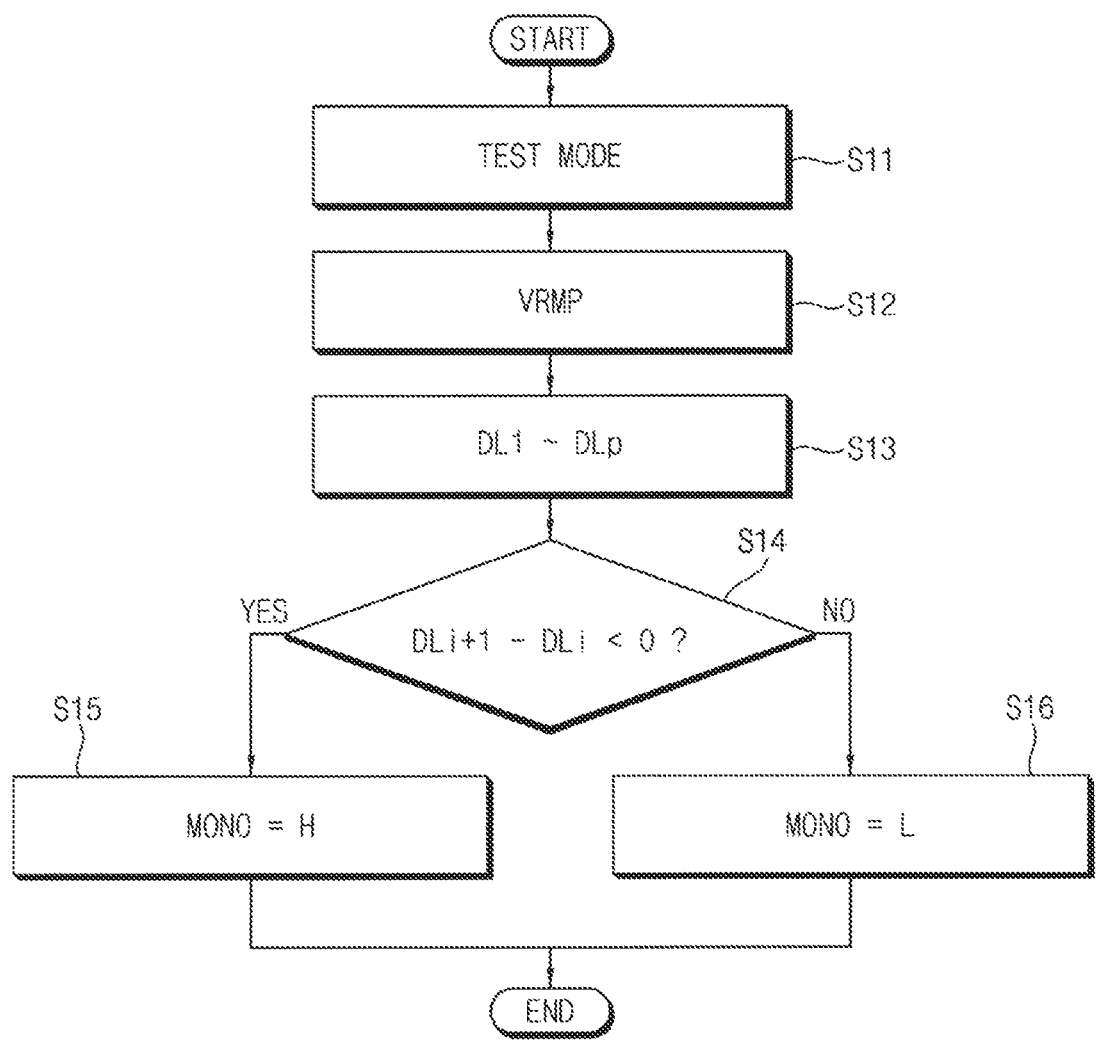
FIGS. 17 and 18 are flowcharts illustrating methods of testing a digital BIST circuit according to an exemplary embodiment of the inventive concept.
Figure 18:
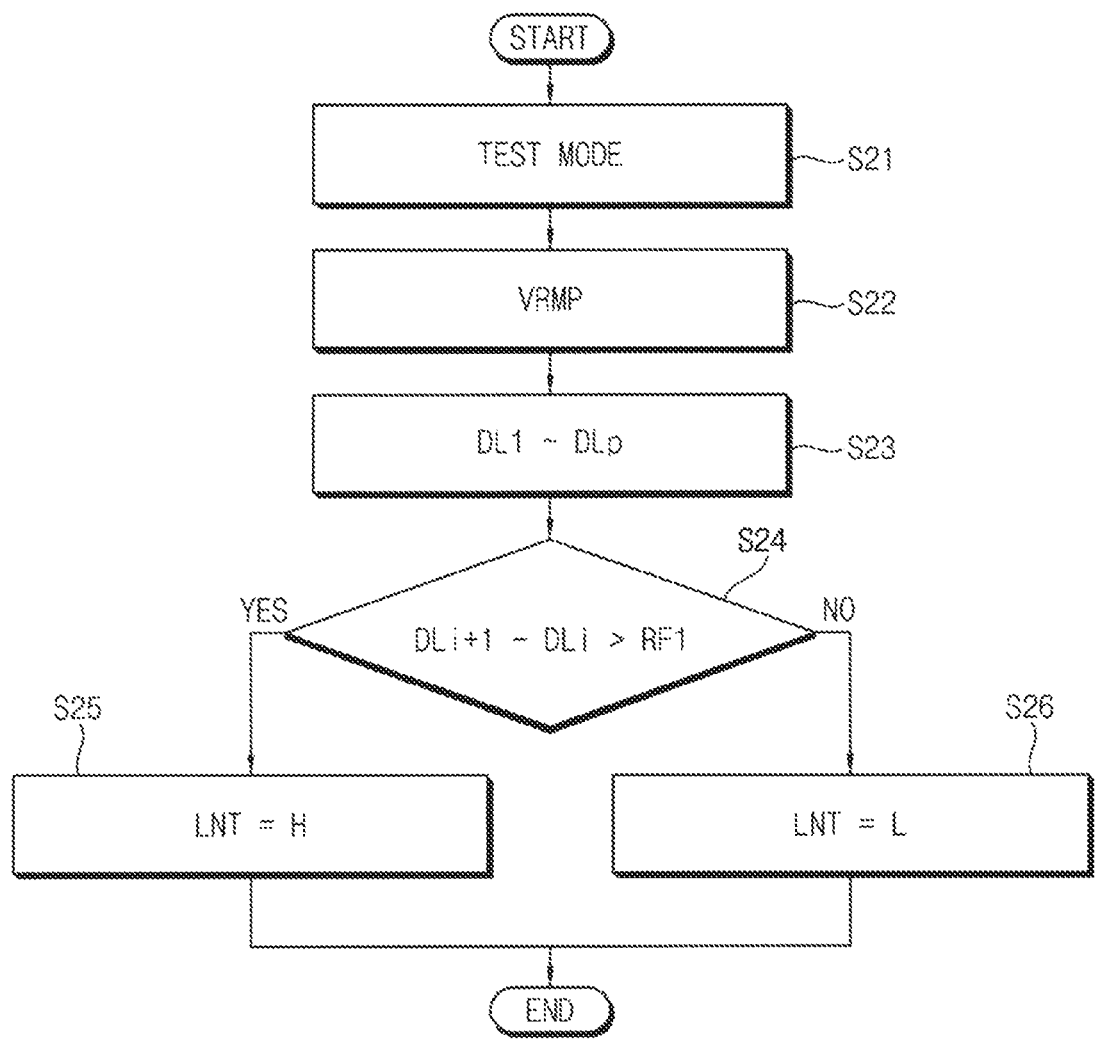

FIGS. 17 and 18 are flowcharts illustrating methods of testing a digital BIST circuit according to an exemplary embodiment of the inventive concept.

Referring to FIGS. 14, 15, and 17, when the temperature measurement circuit enters the test mode (S11), the test signal generator 430 may generate the ramp voltage VRMP and apply the ramp voltage VRMP to the analog-digital converter 200 as the test signal TS (S12).

The digital logic block 440 may receive the plurality of values DL1~DLp of the digital code DCD generated while the ramp voltage VRMP is applied to the analog-digital converter 200 (S13). The digital logic block 440 may determine whether the difference DLi+1−DLi between the two adjacent values DLi+1 and DLi among the plurality of values DL1~DLp is smaller than zero (S14). When the difference DLi+1−DLi is smaller than zero (S14: YES), the digital block 440 may activate a monotony alarm signal MONO to the logic high level H (S15). In contrast, when the difference DLi+1−DLi is not smaller than zero (S14: NO), the digital block 440 may deactivate the monotony alarm signal MONO to the logic low level L (S16).

As such, the digital BIST circuit 400 may generate the monotony alarm signal MONO based on the plurality of values DL1~DLp of the digital code DCD such that the monotony alarm signal MONO may indicate whether the digital code DCD increases or decreases monotonously.

Referring to FIGS. 14, 15, and 18, when the temperature measurement circuit enters the test mode (S21), the test signal generator 430 may generate the ramp voltage VRMP and apply the ramp voltage VRMP to the analog-digital converter 200 as the test signal TS (S22).

The digital logic block 440 may receive the plurality of values DL1~DLp of the digital code DCD generated while the ramp voltage VRMP is applied to the analog-digital converter 200 (S23). The digital logic block 440 may determine whether the difference DLi+1−DLi between the two adjacent values DLi+1 and DLi among the plurality of values DL1~DLp is greater than a reference value RF1 (S24). When the difference DLi+1−DLi is greater than the reference value RF1 (S24: YES), the digital block 440 may activate a linearity alarm signal LNT to the logic high level H (S25). In contrast, When the difference DLi+1−DLi is not greater than the reference value RF1 (S24: NO), the digital block 440 may deactivate the linearity alarm signal LNT to the logic low level L (S26).

As such, the digital BIST circuit 400 may generate the linearity alarm signal LNT based on the plurality of values DL1~DLp of the digital code DCD such that the linearity alarm signal LNT may indicate whether the digital code DCD increases or decreases uniformly.

Figure 19:
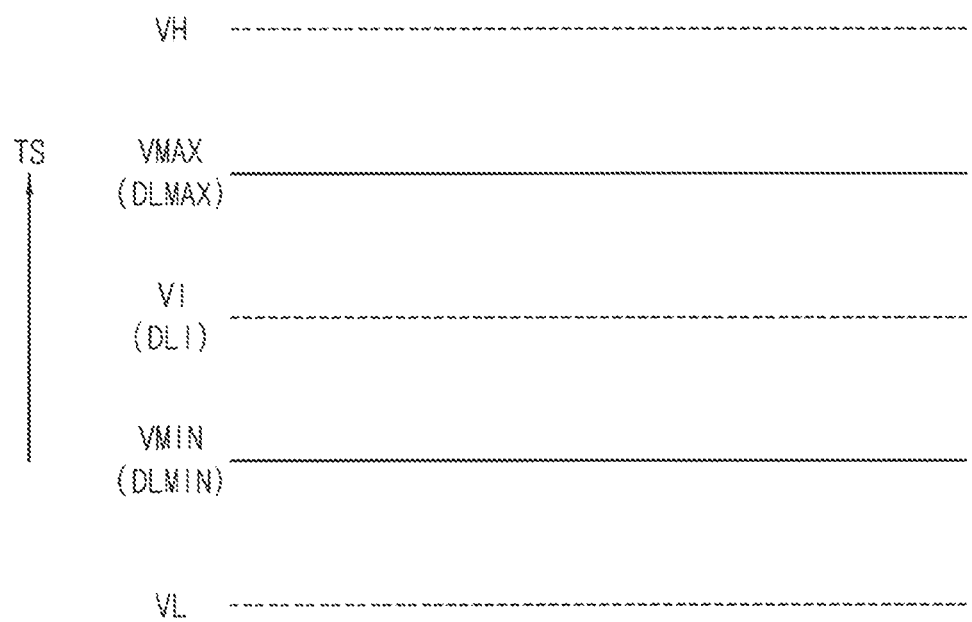
FIG. 19 is a diagram for describing an example operation of the digital BIST circuit of FIG. 14 according to an exemplary embodiment of the inventive concept.

FIG. 19 is a diagram for describing an example operation of the digital BIST circuit of FIG. 14 according to an exemplary embodiment of the inventive concept.

FIG. 19 illustrates a voltage level VMAX corresponding to a maximum value DLMAX of the digital code DCD and a voltage level VMIN corresponding to a minimum value DLMIN of the digital code DCD.

The test signal generator 430 in FIG. 14 may generate the test signal TS to have a voltage level VH higher than the voltage level VMAX corresponding to the maximum value DLMAX of the digital code DCD, a voltage level VL lower than the voltage level VMIN corresponding the minimum value DLMIN of the digital code DCD, or a voltage level VI corresponding to a center value DLI of the digital code DCD.

Test operations as will be described with reference to FIGS. 20 and 21 may be performed using the test signal TS.

Figure 20:
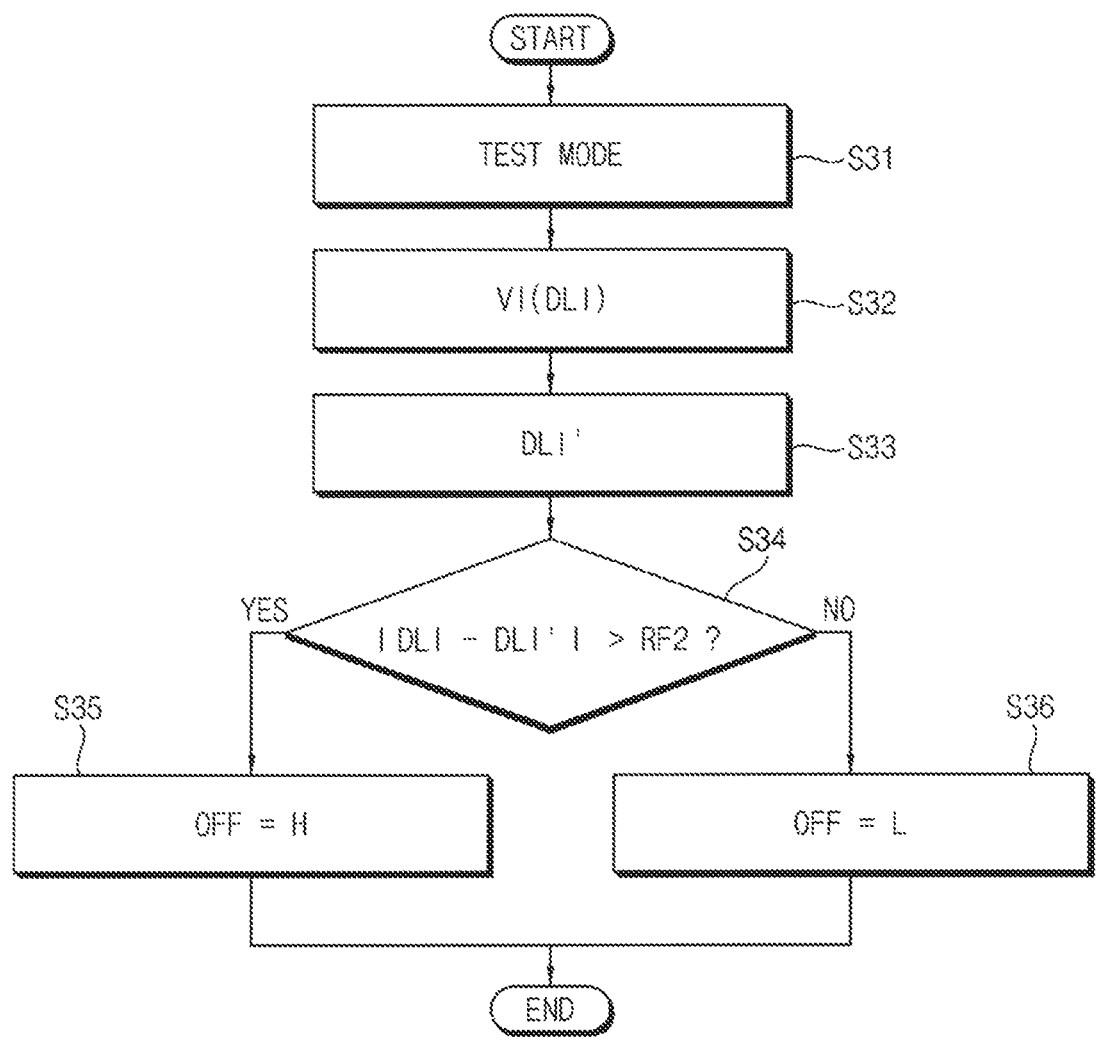
FIGS. 20 and 21 are flowcharts illustrating methods of testing a digital BIST circuit according to an exemplary embodiment of the inventive concept.
Figure 21:
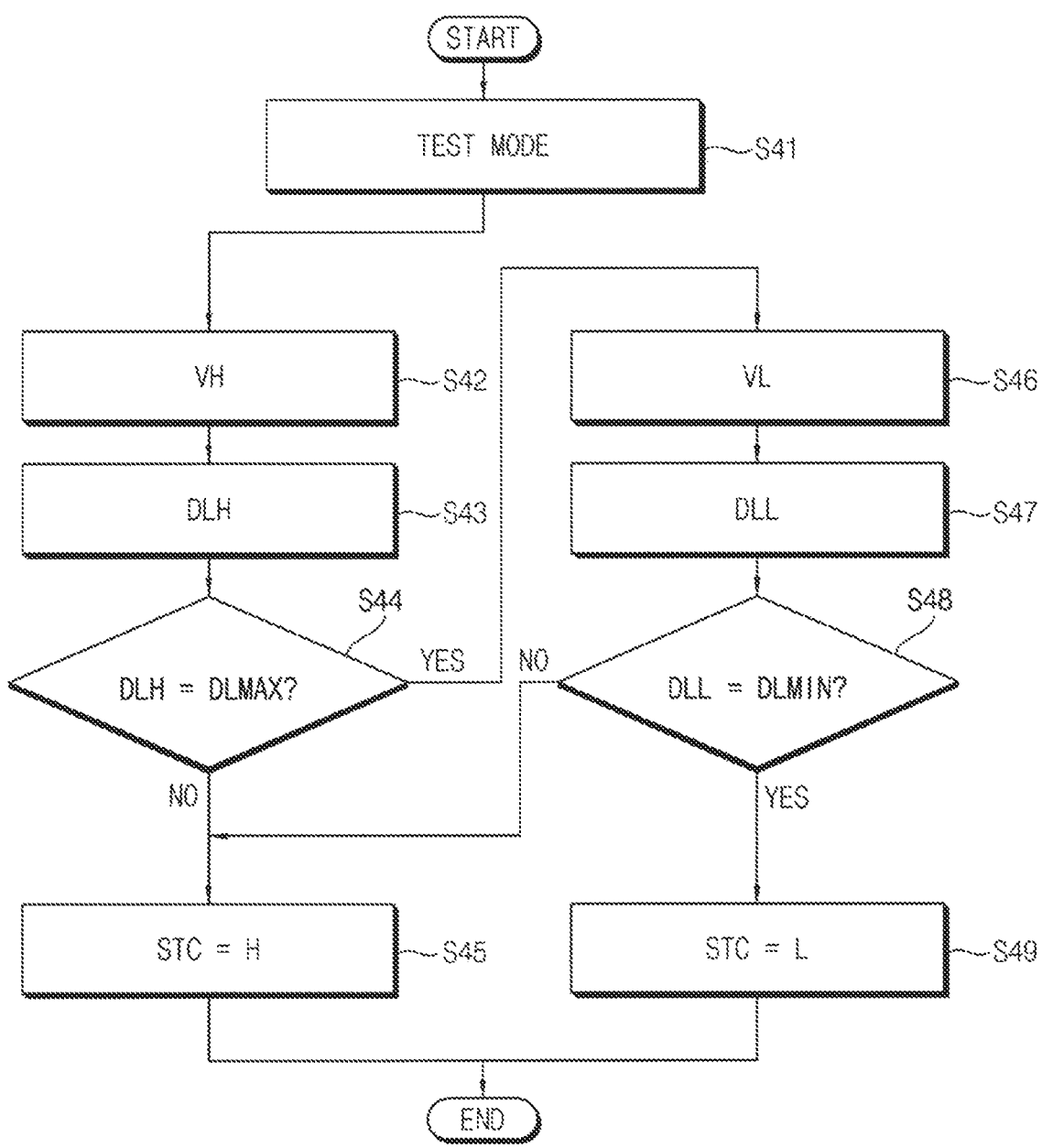

FIGS. 20 and 21 are flowcharts illustrating methods of testing a digital BIST circuit according to an exemplary embodiment of the inventive concept.

Referring to FIGS. 14, 19, and 20, when the temperature measurement circuit enters the test mode (S31), the test signal generator 430 may generate the test signal TS having the voltage level VI corresponding to the center value DLI of the digital code DCD to be applied to the analog-digital converter 200 (S32).

The digital logic block 440 may receive a measured value DLI' of the digital code DCD that is generated while the voltage level VI is applied to the analog-digital converter 200 (S33). The digital logic block 440 may determine whether an absolute difference |DLI−DLI'| between the measured value DLI' and the center value DLI is greater than a reference value RF2 (S34). When the absolute difference |DLI−DLI'| is greater than the reference value RF2 (S34: YES), the digital block 440 may activate an offset alarm signal OFF to the logic high level H (S35). In contrast, when the absolute difference |DLI−DLI'| is not greater than the reference value RF2 (S34: NO), the digital block 440 may deactivate the offset alarm signal OFF to the logic low level L (S35).

As such, the digital BIST circuit 400 may generate the offset alarm signal OFF based on the measured value DLI' and the center value DLI such that the offset alarm signal OFF may indicate whether the offset of the digital code DCD deviates from its normal range represented by the reference value RF2.

Referring to FIGS. 14, 19, and 21, when the temperature measurement circuit enters the test mode (S41), the test signal generator 430 may generate the test signal TS having the voltage level VH higher than the voltage level VMAX corresponding to the maximum value DLMAX of the digital code DCD to be applied to the analog-digital converter 200 (S42).

The digital logic block 440 may receive a first measured value DLH of digital code DCD that is generated while the voltage level VH is applied to the analog-digital converter 200 (S43). The digital logic block 440 may determine whether the first measured value DLH is equal to the maximum value DLMAX (S44). When the first measured value DLH is not equal to the maximum value DLMAX (S44: NO), the digital block 440 may activate a stuck alarm signal STC to the logic high level H (S45).

When the first measured value DLH is equal to the maximum value DLMAX (S44: YES), the test signal generator 430 may generate the test signal TS having the voltage level VL lower than the voltage level VMIN corresponding to the minimum value DLMIN of the digital code DCD to be applied to the analog-digital converter 200 (S46).

The digital logic block 440 may receive a second measured value DLL of digital code DCD that is generated while the voltage level VL is applied to the analog-digital converter 200 (S47). The digital logic block 440 may determine whether the second measured value DLL is equal to the minimum value DLMIN (S48). When the second measured value DLL is not equal to the minimum value DLMIN (S48: NO), the digital block 440 may activate the stuck alarm signal STC to the logic high level H (S45). When the second measured value DLL is equal to the minimum value DLMIN (S48: YES), the digital block 440 may deactivate the stuck alarm signal STC to the logic low level L (S49).

As such, the digital BIST circuit 400 may generate the stuck alarm signal STC based on the first measured value DLH and the second measured value DLL such that the stuck alarm signal STC may indicate whether each bit of the digital code DCD is fixed regardless of the operation temperature.

Figure 22:
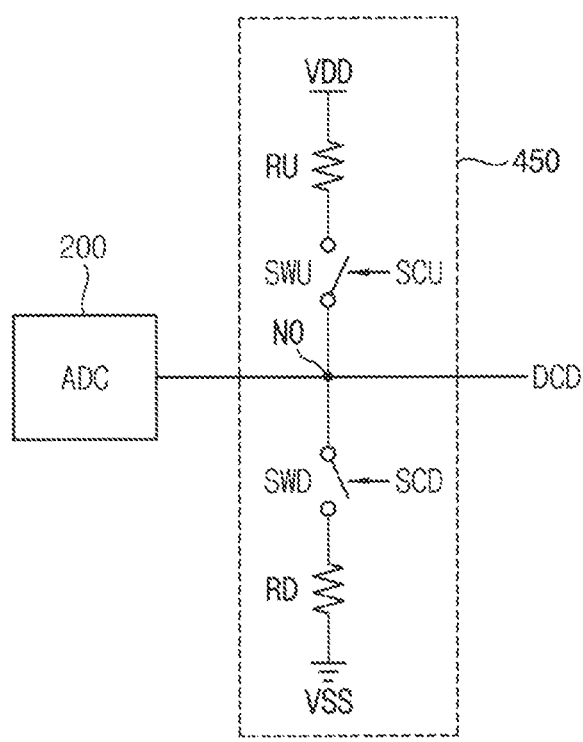
FIG. 22 is a diagram for describing an example operation of the digital BIST circuit of FIG. 14 according to an exemplary embodiment of the inventive concept.

FIG. 22 is a diagram for describing an example operation of the digital BIST circuit of FIG. 14 according to an exemplary embodiment of the inventive concept.

Referring to FIG. 22, the digital BIST circuit 400 may further include a pulling control circuit 450 connected to an output node NO generating the digital code DCD of the analog-digital converter ADC 200. According to exemplary embodiments of the inventive concept, the pulling control circuit 450 may be included in the analog-digital converter 200.

The pulling control circuit 450 of the digital BIST circuit may include a pull-up resistor RU connected to the power supply voltage VDD and a pull-up switch SWU configured to control an electric connection between the pull-up resistor RU and the output node NO of the digital code DCD. In addition, the pulling control circuit 450 may include a pull-down resistor RD connected to the ground voltage VSS and a pull-down switch SWD configured to control an electric connection between the pull-down resistor RD and the output node NO of the digital code DCD. The pull-up switch SWU and the pull-down switch SWD may be turned on based on switch control signals SCU and SCD, respectively, which are provided from the digital logic block 440 in FIG. 14.

In other words, the digital BIST circuit applies the test signal TS having a higher voltage level (VH) than the voltage level VMAX corresponding to the maximum value DLMAX of the digital code DCD to the analog-digital converter circuit when the pull-down switch SWD is turned on and applies the test signal TS having a lower voltage level (VL) than the voltage level VMIN corresponding to the minimum value DLMIN of the digital code DCD to the analog-digital converter 200 when the pull-up switch SWU is turned on in the test mode to generate a floating alarm signal FLT. This will be described further with reference to FIG. 23.

FIG. 22 illustrates a configuration corresponding to one output node NO for convenience of illustration. When a plurality of output nodes are implemented to output multiple bits of the digital code DCD in parallel, a plurality of pulling control circuits may be respectively assigned to the plurality of output nodes.

Test operations as will be described with reference to FIG. 23 may be performed using such a pulling-up path and/or pulling-down path.

Figure 23:
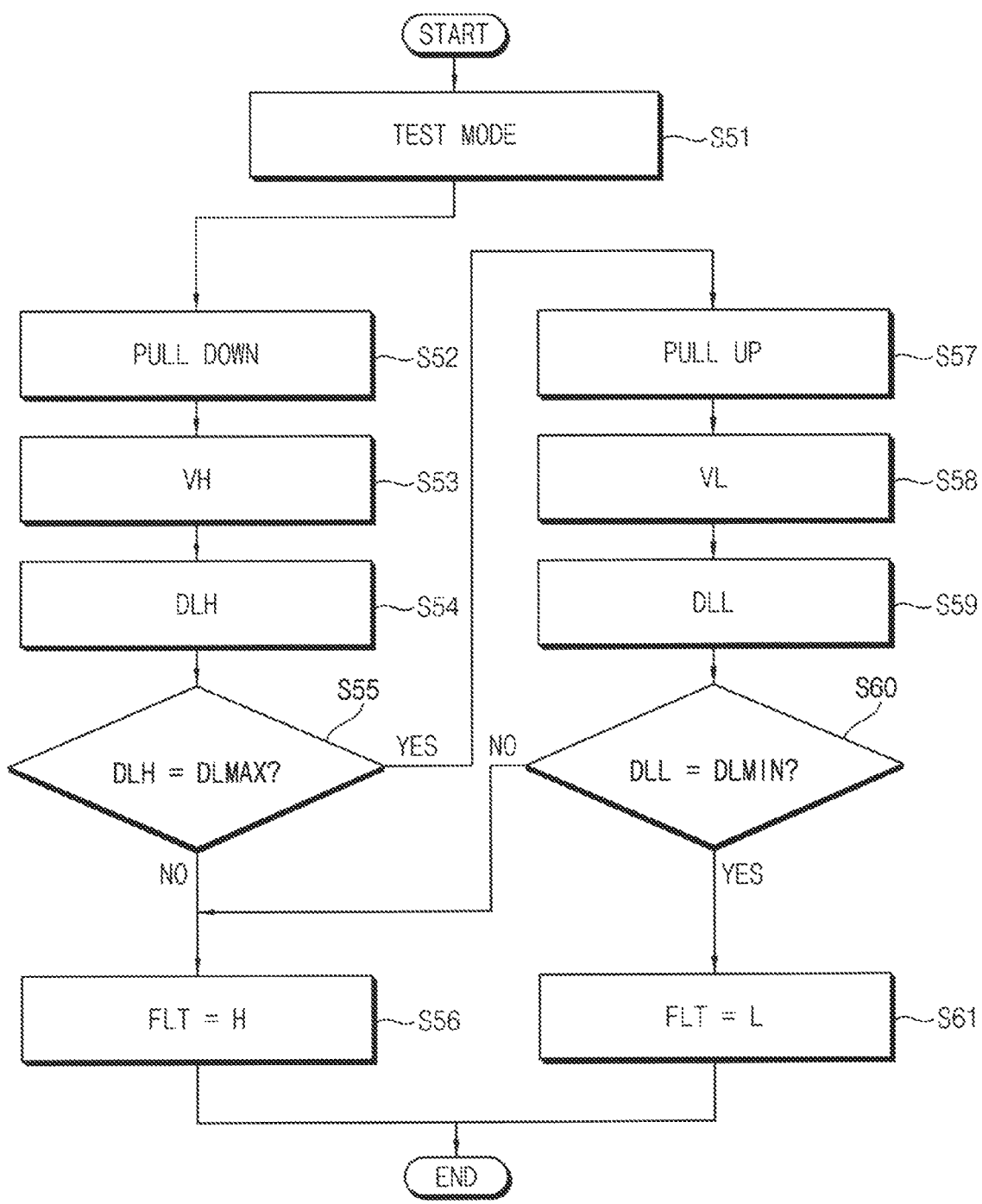
FIG. 23 is a flowchart illustrating a method of testing a digital BIST circuit according to an exemplary embodiment of the inventive concept.

FIG. 23 is a flowchart illustrating a method of testing a digital BIST circuit according to an exemplary embodiment of the inventive concept.

Referring to FIGS. 14, 22, and 23, when the temperature measurement circuit enters the test mode (S51), the test signal generator 430 may activate the switch control signal SCD and pull down the output node NO by electrically connecting the output node NO to the ground voltage VSS (S52). Additionally, the test signal generator 430 may generate the test signal TS having the voltage level VH higher than the voltage level VMAX corresponding to the maximum value DLMAX of the digital code DCD to be applied to the analog-digital converter 200 (S53).

The digital logic block 440 may receive a first measured value DLH of the digital code DCD that is generated while the output node NO is pulled down and the voltage level VH is applied to the analog-digital converter 200 (S54). The digital logic block 440 may determine whether the first measured value DLH is equal to the maximum value DLMAX (S55). When the first measured value DLH is not equal to the maximum value DLMAX (S55: NO), the digital block 440 may activate a floating alarm signal FLT to the logic high level H (S56).

When the first measured value DLH is equal to the maximum value DLMAX (S55: YES), the test signal generator 430 may activate the switch control signal SCH and pull up the output node NO by electrically connecting the output node NO to the power supply voltage VDD (S57). Additionally, the test signal generator 430 may generate the test signal TS having the voltage level VL lower than the voltage level VMIN corresponding to the minimum value DLMIN of the digital code DCD to be applied to the analog-digital converter 200 (S58).

The digital logic block 440 may receive a second measured value DLL of digital code DCD that is generated while the output node NO is pulled up and the voltage level VL is applied to the analog-digital converter 200 (S59). The digital logic block 440 may determine whether the second measured value DLL is equal to the minimum value DLMIN (S60). When the second measured value DLL is not equal to the minimum value DLMAX (S60: NO), the digital block 440 may activate the floating alarm signal FLT to the logic high level H (S56). When the second measured value DLL is equal to the minimum value DLMAX (S60: YES), the digital block 440 may deactivate the floating alarm signal FLT to the logic low level L (S61).

As such, the digital BIST circuit 400 may generate the floating alarm signal FLT based on the first measured value DLH and the second measured value DLL such that the floating alarm signal FLT may indicate whether the output node NO of the digital code DCD is opened.

Figure 24:
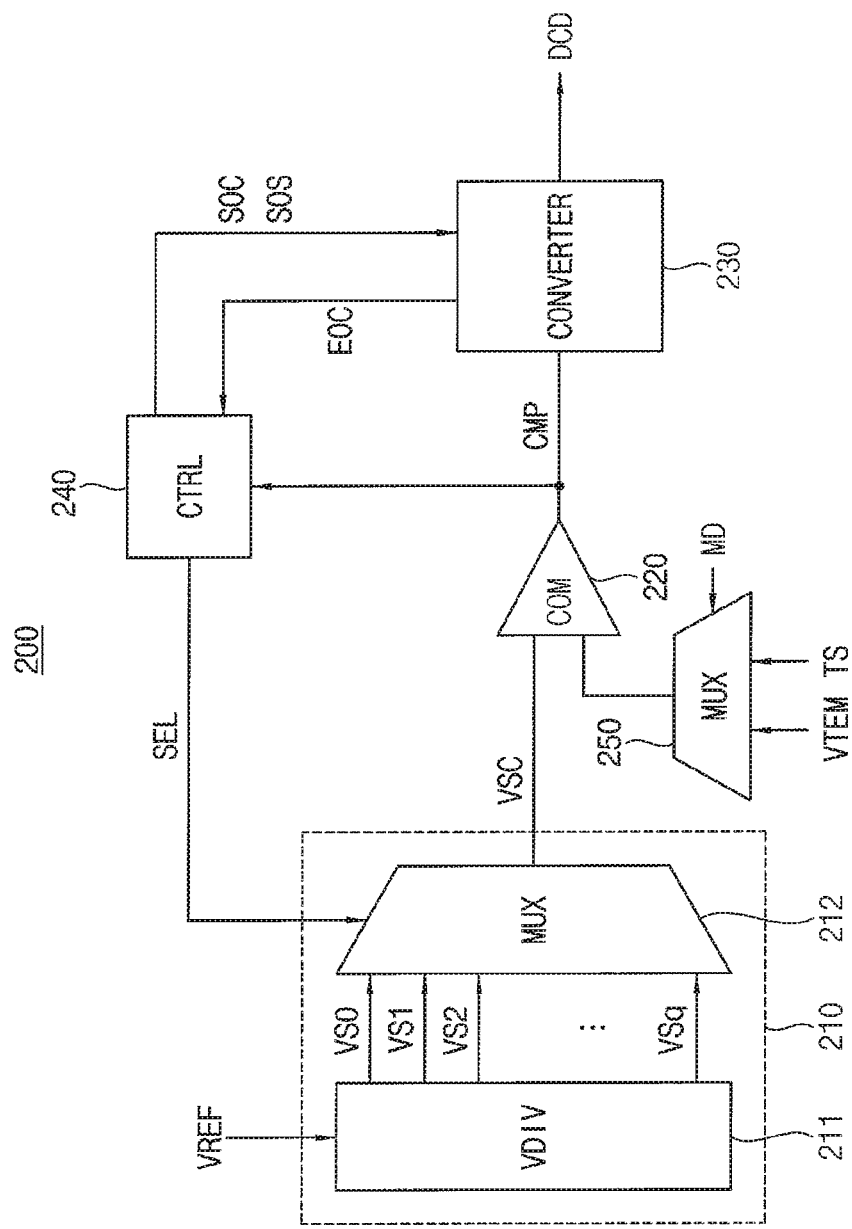
FIG. 24 is a block diagram illustrating an analog-digital converter included in a temperature measurement circuit according to an exemplary embodiment of the inventive concept.

FIG. 24 is a block diagram illustrating an analog-digital converter included in a temperature measurement circuit according to an exemplary embodiment of the inventive concept.

Referring to FIG. 24, the analog-digital converter 200 may include a scan voltage generator 210, a comparator COM 220, a converter 230, and a controller CTRL 240. The scan voltage generator 210, the comparator 220, the converter 230, and the controller 240 may be circuits. In addition, the analog-digital converter 200 may further include an input selector MUX 250 configured to select one of the temperature-variant voltage VTEM and the test signal TS based on a mode signal MD to apply the selected one to the comparator 220. Using the input selector 250, the test signal TS instead of the temperature-variant voltage VTEM may be applied to the analog-digital converter 200 in the test mode.

The scan voltage generator 210 may generate a plurality of scan voltages VS0~VSq having different voltage levels based on the measurement reference voltage VREF, and output the plurality of scan voltages VS0~VSq one by one by a unit scan time tS as will be described below with reference to FIGS. 25 and 26. The scan voltage generator 210 may include a voltage divider 211 configured to generate the plurality of scan voltages VS0~VSq based on the measurement reference voltage VREF and a selector MUX 212 configured to select and output one of the plurality of scan voltages VSC based on a selection signal SEL.

The comparator 220 may generate a plurality of comparison result values CMP by comparing the temperature-variant voltage VTEM or the test signal TS with the plurality of scan voltages VS0~VSq. The converter 230 may generate the digital code DCD based on the plurality of comparison result values CMP.

The controller 240 may control the scan voltage generator 210, the comparator 220, and the converter 230. The controller 240 may generate the selection signal SEL to control the selector 212. The controller 240 may generate a scan start signal SOS and a conversion start signal SOC to control the converter 230. The controller may receive a conversion end signal EOC from the converter 230.

Figure 25:
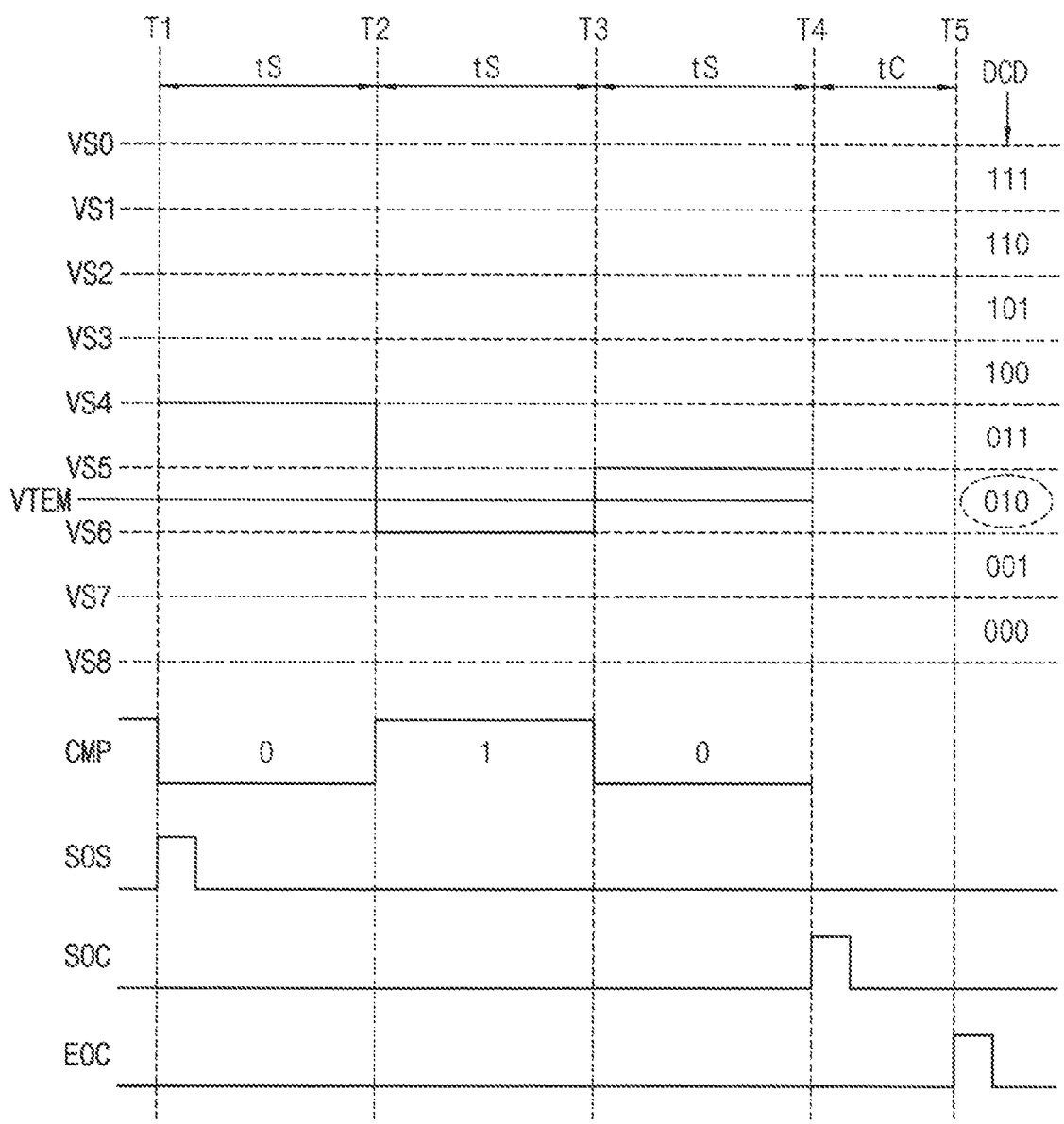
FIGS. 25 and 26 are diagrams for describing an example operation of the analog-digital converter of FIG. 24 according to an exemplary embodiment of the inventive concept.
Figure 26:
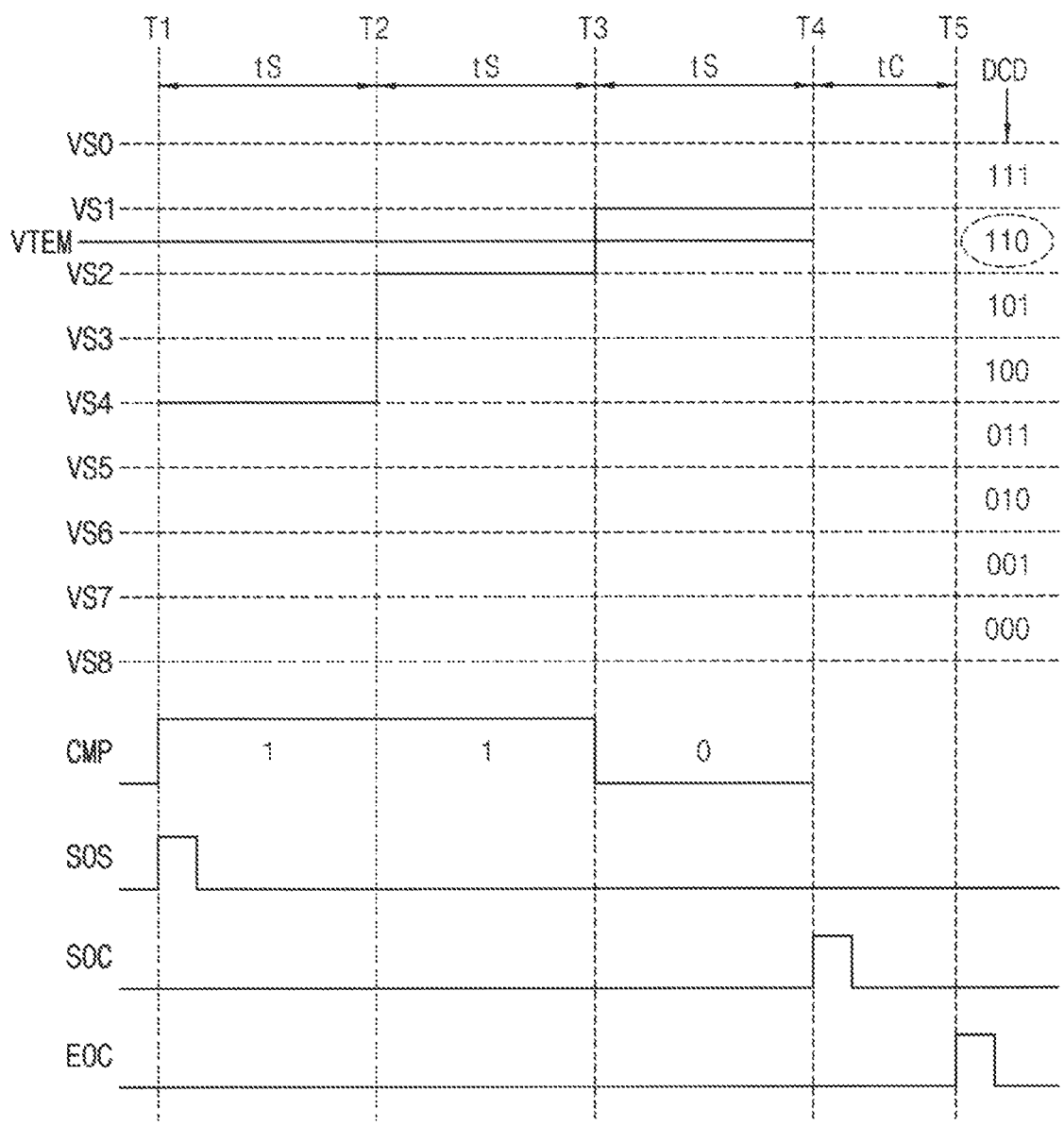

FIGS. 25 and 26 are diagrams for describing an example operation of the analog-digital converter of FIG. 24 according to an exemplary embodiment of the inventive concept. FIG. 25 illustrates an example where the temperature-variant voltage VTEM corresponds to a value "010" of the digital code DCD and FIG. 26 illustrates another example where the temperature-variant voltage VTEM corresponds to a value "110" of the digital code DCD.

Referring to FIGS. 25 and 26, during a plurality of unit scan times tS, the plurality of scan voltages VS0~VSq may be selected by a binary scan scheme such that the scan voltage for the next unit scan time is determined based on the comparison result of the comparator 220 during the previous unit scan time. However, the inventive concept is not limited to such a binary scan scheme.

The counter 410 in FIG. 14 may generate a settling alarm signal STT based on the scan start signal SOS and the conversion start signal SOC such that the settling alarm signal STT may indicate whether a total scan time for outputting the plurality of scan voltages VS0~VSq from the scan voltage generator 210 is shorter than a first reference time. Here, the total scan time corresponds to N*tS where N is the bit number of the digital code DCD and tS is the unit scan time. In addition, the counter 410 may generate a conversion alarm signal CNV based on the conversion start signal SOC and the conversion end signal EOC such that the conversion alarm signal CNV may indicate whether a conversion time tC for generating the digital code DCD by the converter 230 is shorter than a second reference time.

Figure 27:
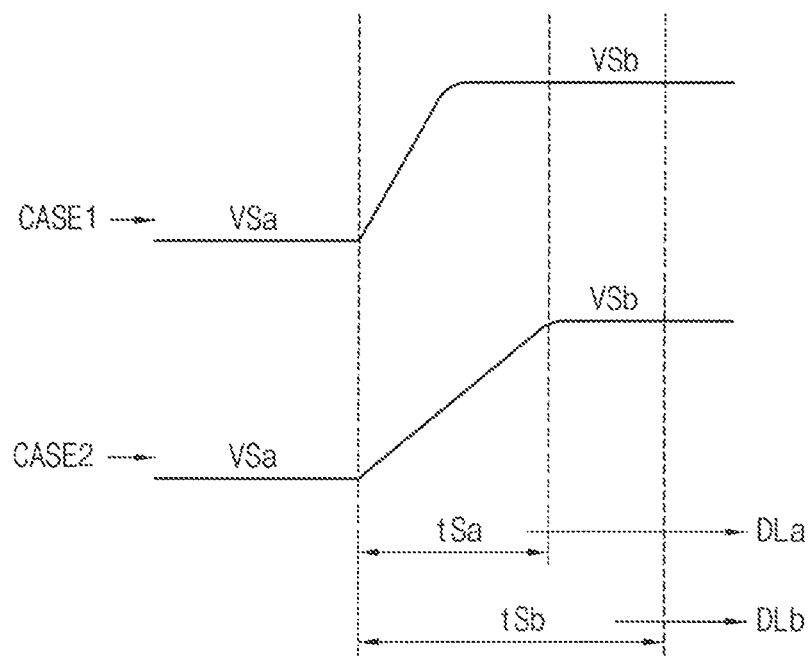
FIG. 27 is a diagram for describing a transition time of a ramp voltage according to an exemplary embodiment of the inventive concept.

FIG. 27 is a diagram for describing a transition time of a ramp voltage according to an exemplary embodiment of the inventive concept.

FIG. 27 illustrates a first case CASE1 and a second case CASE2 where the scan voltage is changed from a first scan voltage VSa to a second scan voltage VSb. The first case CASE1 indicates that the transition time for the change is relatively short and the second case CASE2 indicates that the transition time for the change is relatively long. If the binary scan scheme is performed based on a first unit scan time tSa that is relatively short, the time for the transition of the scan voltage may not be secured. For example, a measured value DLa may indicate the exact value of the digital code DCD in the first case CASE1 but an error may be included in the measured value DLa in the second case CASE2. In contrast, if the binary scan scheme is performed based on a second unit scan time tSb that is relatively long, the time for the transition of the scan voltage may be secured. For example, a measured value DLb may indicate the exact value of the digital code DCD in the first case CASE1 and the second case CASE2.

Test operations as will be described with reference to FIG. 28 may be performed using such control of the unit scan times.

Figure 28:
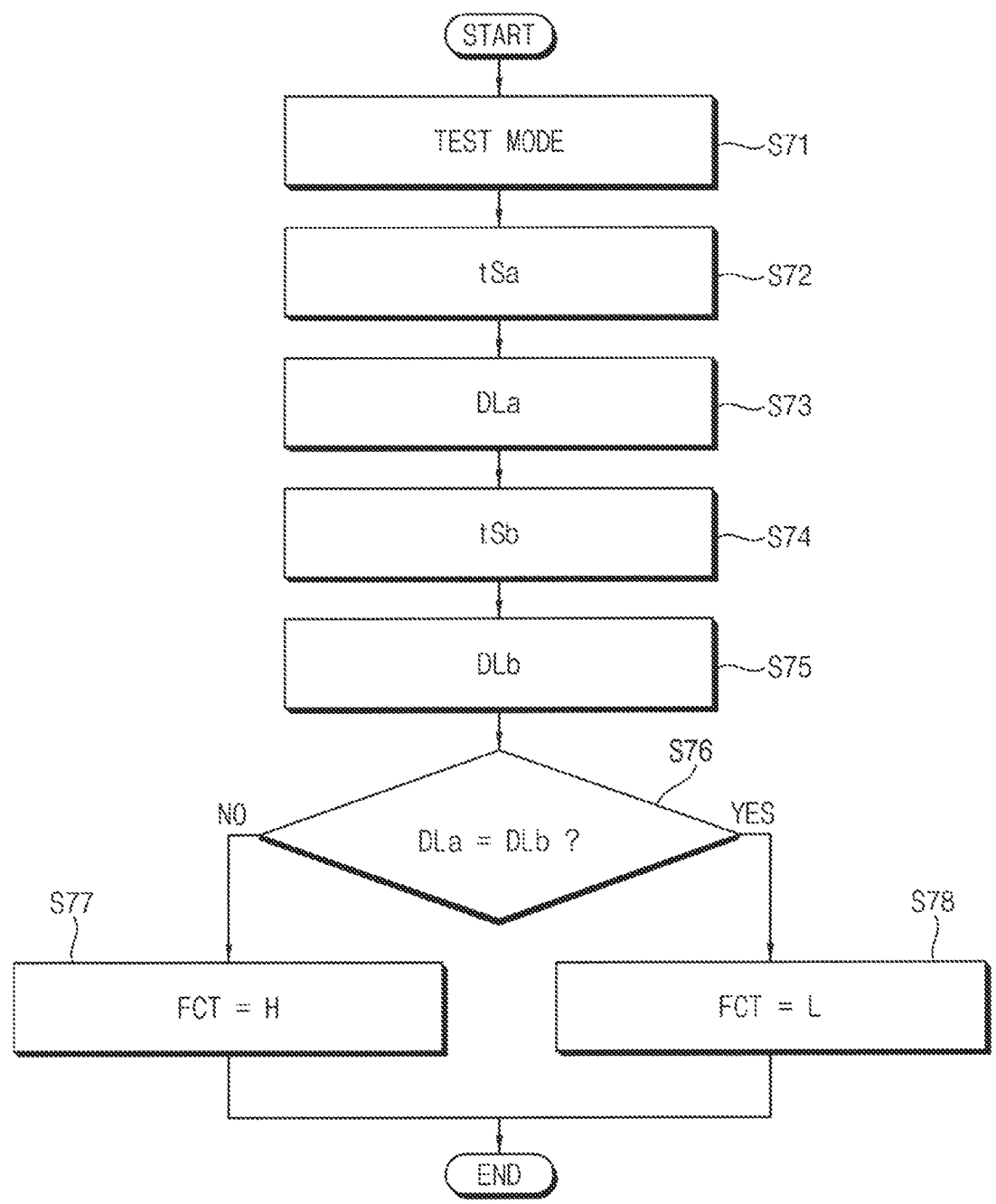
FIG. 28 is a flowchart illustrating a method of testing a digital BIST circuit according to an exemplary embodiment of the inventive concept.

FIG. 28 is a flowchart illustrating a method of testing a digital BIST circuit according to an exemplary embodiment of the inventive concept.

Referring to FIGS. 14 and 24 through 28, when the temperature measurement circuit enters the test mode (S71), the digital BIST circuit 400 may control the analog-digital converter 200 such that the analog-digital converter 200 may perform the binary scan operation based on the first unit scan time tSa (S72) and the digital logic block 440 may receive the first measured value DLa of the digital code DCD corresponding to the first unit scan time tSa (S73). In addition, the digital BIST circuit 400 may control the analog-digital converter 200 such that the analog-digital converter 200 may perform the binary scan operation based on the second unit scan time tSb (S74) and the digital logic block 440 may receive the second measured value DLb of the digital code DCD corresponding to the second unit scan time tSb (S75).

The digital logic block 440 may determine whether the first measured value DLa is equal to the second measured value DLb (S76). When the first measured value DLa is not equal to the second measured value DLb (S76: NO), the digital block 440 may activate a fluctuation alarm signal FCT to the logic high level H (S77). In contrast, when the first measured value DLa is equal to the second measured value DLb (S76: YES), the digital block 440 may deactivate a fluctuation alarm signal FCT to the logic low level L (S78).

As such, the digital BIST circuit 400 may generate the fluctuation alarm signal FCT based on the first measured value DLa corresponding to the first unit scan time tSa and the second measured value DLb corresponding to the second unit scan time tSb such that the fluctuation alarm signal FCT may indicate whether the unit scan time is included in the normal range.

Figure 29:
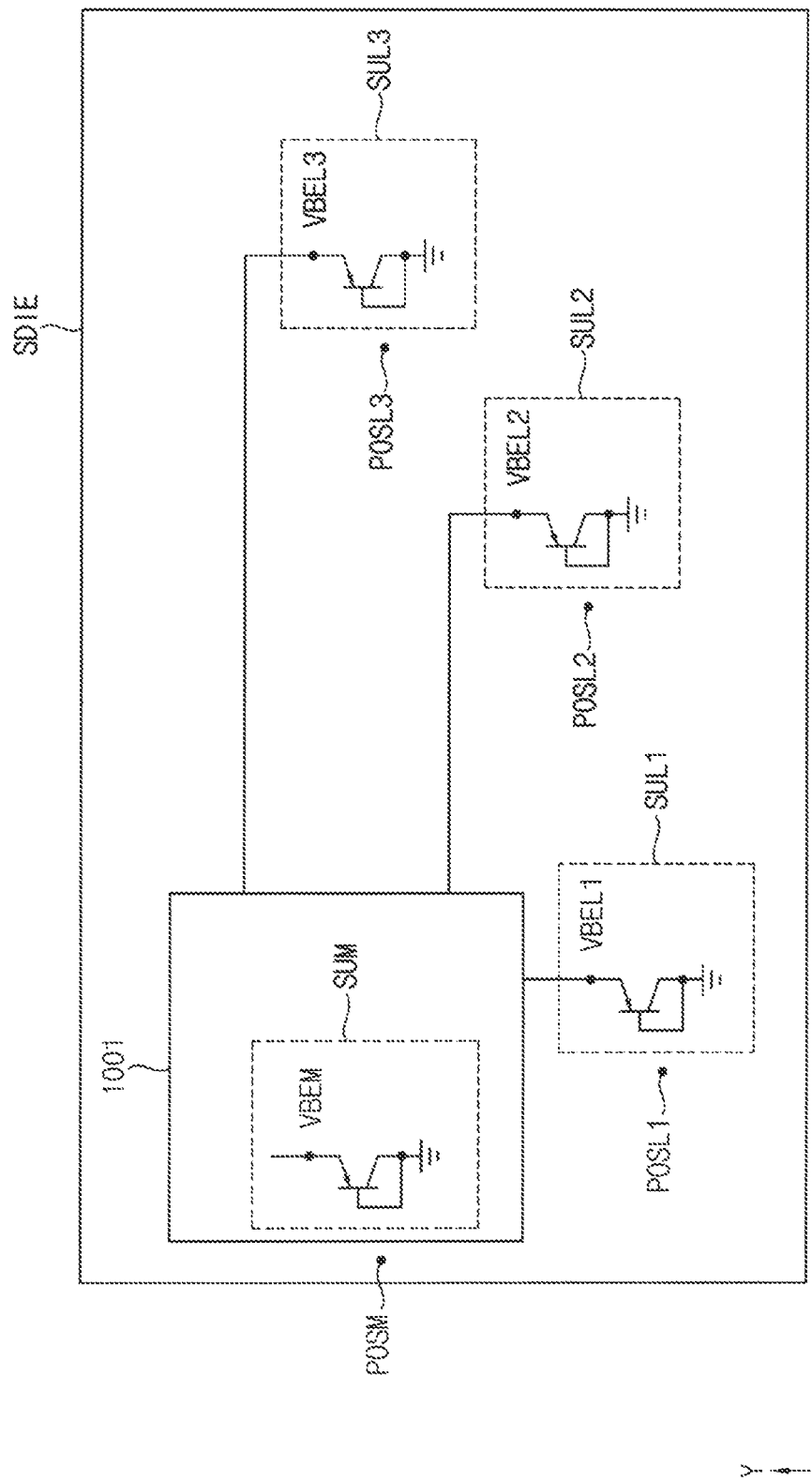
FIG. 29 is a diagram illustrating an example layout of a temperature measurement circuit according to an exemplary embodiment of the inventive concept.
Figure 30:
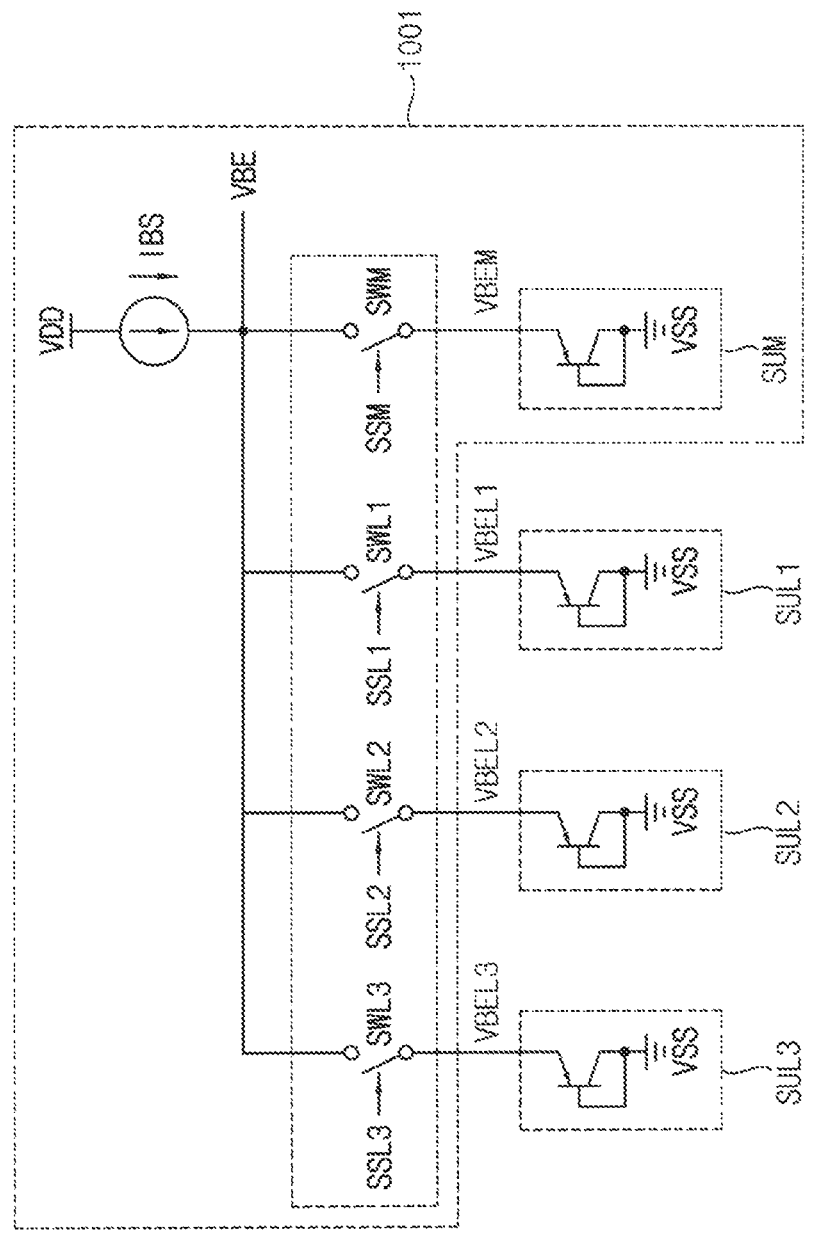
FIG. 30 is a circuit diagram illustrating an example configuration of the temperature measurement circuit of FIG. 29 according to an exemplary embodiment of the inventive concept.

FIG. 29 is a diagram illustrating an example layout of a temperature measurement circuit according to an exemplary embodiment of the inventive concept, and FIG. 30 is a circuit diagram illustrating an example configuration of the temperature measurement circuit of FIG. 29 according to an exemplary embodiment of the inventive concept.

Referring to FIGS. 29 and 30, a temperature measurement circuit may include a main circuit 1001 and a plurality of local sensing units SUL1~SUL3, which are integrated in a semiconductor die SDIE. The main circuit 1001 may include a main sensing unit SUM. The main circuit 1001 may also include a temperature detection circuit and a BIST circuit as described above.

The main sensing unit SUM may be disposed at a main position POSM and generate a main sensing voltage VBEM that is varied depending on a main operation temperature at the main position POSM.

The plurality of local sensing units SUL1~SUL3 may be disposed at a plurality of local positions POSL1~POSL3 and generate a plurality of local sensing voltages VBEL1~VBEL3 that are varied depending on local operation temperatures at the plurality of local positions POSL1~POSL3.

As illustrated in FIG. 30, the main sensing unit SUM and the plurality of local sensing units SUL1~SUL3 may be selectively connected to a current source generating the bias current IBS using switches SWM and SWL1~SWL3. Control signals SSM and SSL1~SSL3 to control the switches SWM and SWL1~SWL3, respectively, may be provided from the digital logic block 440 in the digital BIST circuit 400.

Test operations as will be described with reference to FIG. 31 may be performed using such sensing units.

Figure 31:
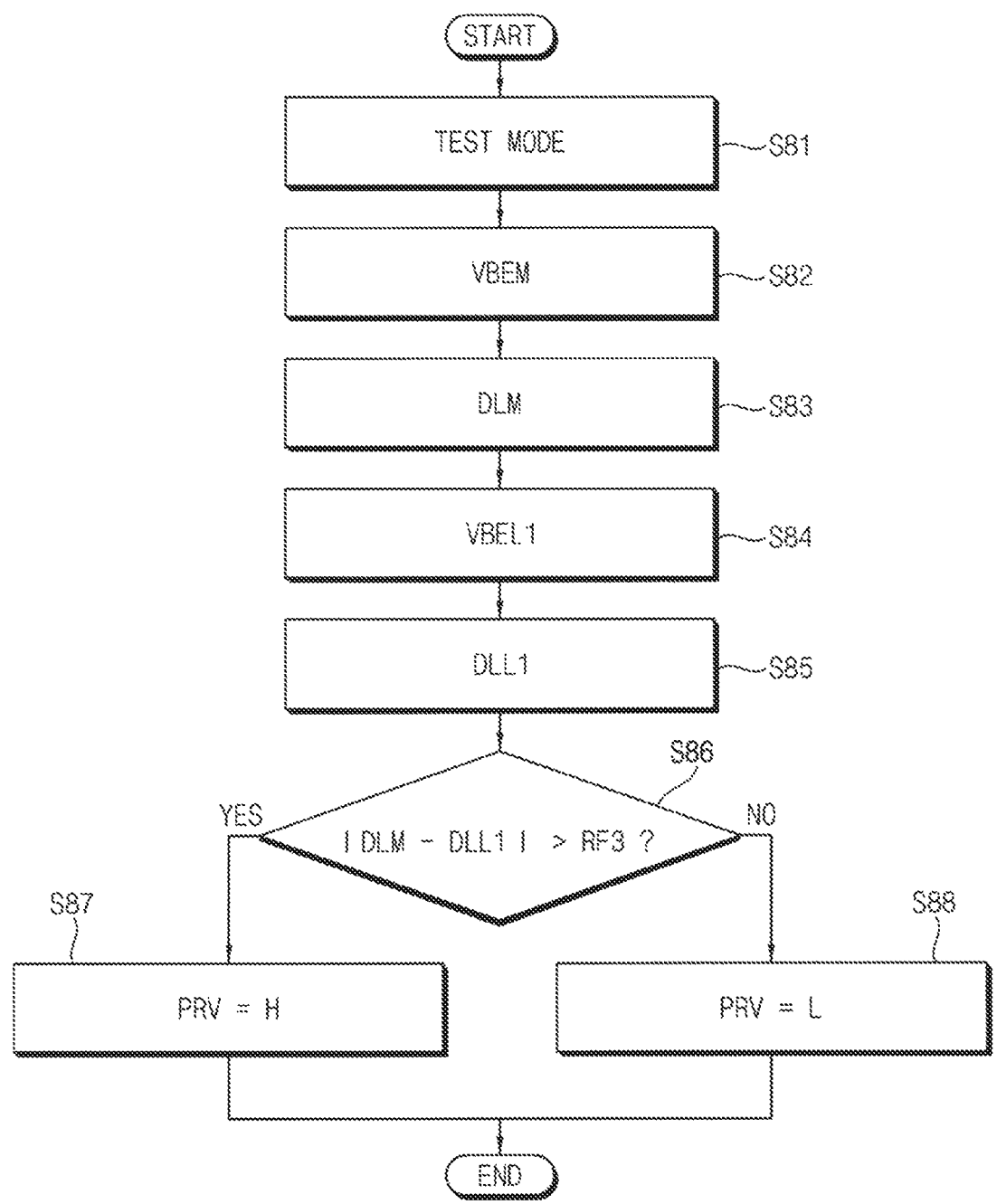
FIG. 31 is a flowchart illustrating a method of testing a digital BIST circuit according to an exemplary embodiment of the inventive concept.

FIG. 31 is a flowchart illustrating a method of testing a digital BIST circuit according to an exemplary embodiment of the inventive concept.

Referring to FIG. 14 and FIGS. 29 through 31, when the temperature measurement circuit enters the test mode (S81), the digital BIST circuit 400 may select the main sensing voltage VBEM generated by the main sensing unit SUM (S82) and receive a first measured value DLM of the digital code DCD corresponding to the main sensing voltage VBEM (S83). In addition, the digital BIST circuit 400 may select the local sensing voltage VBEL1 generated by the local sensing unit SUL1 nearest to the main sensing unit SUM (S84) and receive a second measured value DLL1 of the digital code DCD corresponding to the local sensing voltage VBEL1 (S85).

The digital logic block 440 may determine whether an absolute difference |DLM−DLL1| between the first and second measured values DLM and DLL1 is greater than a reference value RF3 (S86). When the absolute difference |DLM−DLL1| is greater than the reference value RF3 (S86: YES), the digital block 440 may activate a probe-check alarm signal PRV to the logic high level H (S87). In contrast, when the absolute difference |DLM−DLL1| is not greater than the reference value RF3 (S86: NO), the digital block 440 may deactivate a probe-check alarm signal PRV to the logic low level L (S88).

As such, the digital BIST circuit 400 may generate the probe-check alarm signal PRV based on the first measured value DLM corresponding to the main sensing voltage VBEM and the second measured value DLL1 corresponding to the local sensing voltage VBEL1.

Figure 32:
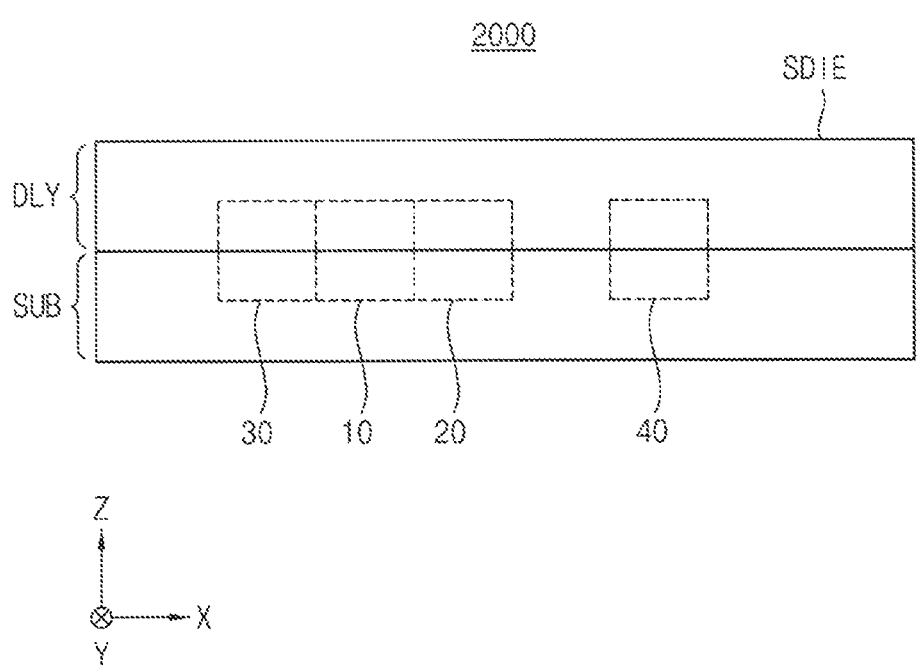
FIG. 32 is a diagram illustrating a semiconductor integrated circuit including a temperature measurement circuit according to an exemplary embodiment of the inventive concept.

FIG. 32 is a diagram illustrating a semiconductor integrated circuit including a temperature measurement circuit according to an exemplary embodiment of the inventive concept.

Referring to FIG. 32, a semiconductor integrated circuit 2000 may include an internal circuit 30, a temperature detection circuit 10, a BIST circuit 20, and a control circuit 40, which are integrated in the same semiconductor die SDIE. In exemplary embodiments of the inventive concept, the control circuit 40 may be disposed in another semiconductor die. The semiconductor die SDIE may include a semiconductor substrate SUP and a dielectric layer DLY above the semiconductor substrate SUB. The temperature detection circuit 10 may detect an operation temperature of the internal circuit 30, and the BIST circuit 20 may monitor whether the temperature detection circuit 10 operates normally. As described, the BIST circuit 20 may provide the flag signals and/or the alarm signals as monitoring results to the control circuit 40. The control circuit 40 may control the semiconductor integrated circuit 2000 based on the flag signals and/or the alarm signals.

Figure 33:
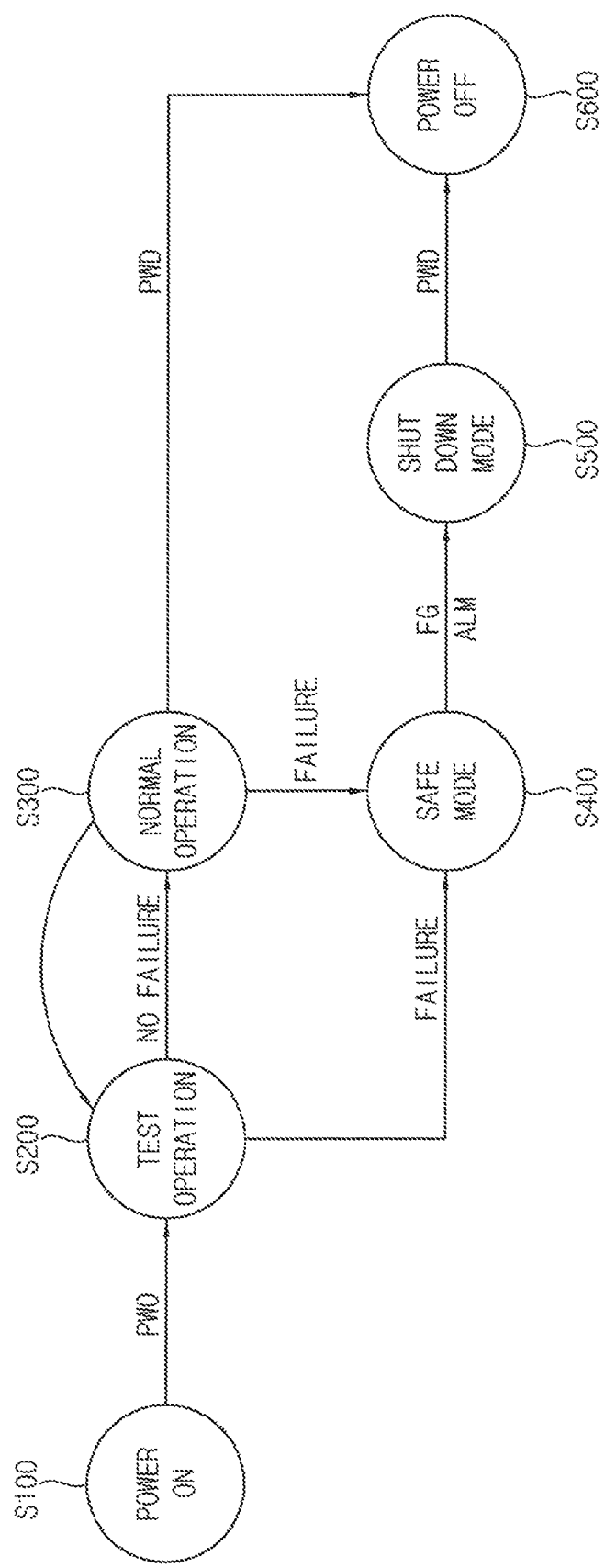
FIG. 33 is a diagram illustrating an operation of a system including a temperature measurement circuit according to an exemplary embodiment of the inventive concept.

FIG. 33 is a diagram illustrating an operation of a system including a temperature measurement circuit according to an exemplary embodiment of the inventive concept.

Referring to FIG. 33, when a system is powered on (S100), a temperature measurement circuit may perform test operations in response to a power-on signal PWO (S200). When the temperature measurement circuit operates normally (NO FAILURE), the temperature measurement circuit may detect an operation temperature of the system (S300). When the temperature measurement circuit operates abnormally (FAILURE), the system may enter a safe mode (S400), and the above-described flag signals FG and/or the alarm signals ALM may be provided by the BIST circuit included in the temperature measurement circuit. The system may set the temperature measurement circuit in a shut-down mode based on the flag signals FG and/or the alarm signals ALM (S500). The system may power off the temperature measurement circuit (S600) in response to a power-down signal PWD to block the output of the temperature measurement circuit or save power consumption.

As described above, the BIST circuit and the temperature measurement circuit according to exemplary embodiments of the inventive concept may efficiently diagnose failure of the temperature measurement circuit by monitoring whether various voltages are in normal ranges using the BIST circuit.

In addition, the BIST circuit and the temperature measurement circuit according to exemplary embodiments of the inventive concept may efficiently diagnose the analog-digital converter included in the temperature measurement circuit by performing various tests using the digital BIST circuit.

The inventive concept may be applied to any electronic devices and systems requiring information on an operation temperature. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A temperature measurement circuit comprising:
   a band-gap reference circuit configured to generate a band-gap reference voltage that is fixed regardless of an operation temperature;
   a reference voltage generator circuit configured to generate a measurement reference voltage by adjusting the band-gap reference voltage;
   a sensing circuit configured to generate a temperature-variant voltage based on a bias current, wherein the temperature-variant voltage is varied depending on the operation temperature;
   an analog-digital converter circuit configured to generate a first digital code indicating the operation temperature based on the measurement reference voltage and the temperature-variant voltage; and
   an analog built-in self-test (BIST) circuit configured to generate
      a first flag signal indicating whether the band-gap reference voltage is within a first predetermined range,
      a second flag signal indicating whether the measurement reference voltage is within a second predetermined range, and
      a third flag signal indicating whether a bias voltage corresponding to the bias current is within a third predetermined range.

2. The temperature measurement circuit of claim 1, wherein the analog BIST circuit comprises:
   a power supply voltage divider circuit configured to generate a power division voltage corresponding to a lowest limit level of the band-gap reference voltage by dividing a power supply voltage; and
   a comparator circuit configured to
      compare the band-gap reference voltage to the power division voltage, and
      activate the first flag signal in response to the band-gap reference voltage being lower than the lowest limit level of the band-gap reference voltage.

3. The temperature measurement circuit of claim 1, wherein the analog BIST circuit comprises:
   a band-gap reference voltage divider circuit configured to generate a first band-gap division voltage corresponding a highest limit level of the measurement reference voltage and a second band-gap division voltage corresponding to a lowest limit level of the measurement reference voltage by dividing the band-gap reference voltage;
   a measurement reference voltage divider circuit configured to generate a measurement division voltage by dividing the measurement reference voltage; and
   a comparator circuit configured to
      compare the measurement division voltage to the first band-gap division voltage and the second band-gap division voltage, and
      activate the second flag signal in response to is the measurement reference voltage being higher than the highest limit level of the measurement reference voltage or lower than the lowest limit level of the measurement reference voltage.

4. The temperature measurement circuit of claim 1, wherein the analog BIST circuit comprises:
   a measurement reference voltage divider circuit configured to generate a first measurement reference division voltage corresponding to a highest limit level of the bias voltage and a second measurement reference division voltage corresponding to a lowest limit level of the bias voltage by dividing the measurement reference voltage;
   a current-voltage converter circuit configured to generate the bias voltage based on the bias current; and
   a comparator circuit configured to
      compare the bias voltage with the first measurement reference division voltage and the second measurement reference division voltage, and
      activate the third flag signal in response to the bias voltage being higher than the highest limit level of the bias voltage or lower than the lowest limit level of the bias voltage.

5. The temperature measurement circuit of claim 4, wherein the sensing circuit comprises a first current source configured to generate the bias current and the current-voltage converter circuit comprises a second current source configured to generate the bias current such that the first current source and the second current source form a current mirror.

6. The temperature measurement circuit of claim 1, wherein the analog BIST circuit comprises:
   a band-gap reference voltage monitor circuit configured to activate the first flag signal based on the band-gap reference voltage and a power supply voltage in response to the band-gap reference voltage deviating from the first predetermined range;
   a measurement reference voltage monitor circuit configured activate the second flag signal based on the measurement reference voltage and the band-gap reference voltage in response to the measurement reference voltage deviating from the second predetermined range; and a bias voltage monitor circuit configured to activate the third flag signal based on the bias voltage and the measurement reference voltage in response to the bias voltage deviating from the third predetermined range.

7. The temperature measurement circuit of claim 1, further comprising:
   a digital BIST circuit configured to
   apply a test signal instead of the temperature-variant voltage to the analog-digital converter circuit,
   receive a second digital code from the analog-digital converter circuit, and
   generate a plurality of alarm signals based on the second digital code, wherein the plurality of alarm signals indicate an operation state of the analog-digital converter circuit.

8. The temperature measurement circuit of claim 7, wherein the digital BIST circuit comprises:
   a test signal generator circuit configured to generate a ramp voltage having a voltage level sequentially increasing or sequentially decreasing and to apply the ramp voltage as the test signal to the analog-digital converter circuit.

9. The temperature measurement circuit of claim 8, wherein the digital BIST circuit is configured to generate at least one of a monotony alarm signal or a linearity alarm signal based on a plurality of values of the second digital code,
   wherein the monotony alarm signal indicates whether the second digital code increases or decreases monotonously, and
   wherein the linearity alarm signal indicates whether the second digital code varies uniformly.

10. The temperature measurement circuit of claim 7, wherein the test signal has a voltage level corresponding to a center value of the second digital code, and
   wherein the digital BIST circuit is configured to apply the test signal to the analog-digital converter circuit to generate an offset alarm signal indicating whether a difference between a measured value of the second digital code and the center value of the second digital code is greater than a reference value.

11. The temperature measurement circuit of claim 7, wherein the test signal has a higher voltage level than a voltage level corresponding to a maximum value of the second digital code, and
   wherein the digital BIST circuit is configured to apply the test signal to the analog-digital converter circuit to generate a stuck alarm signal indicating whether a first measured value of the second digital code is equal to the maximum value of the second digital code.

12. The temperature measurement circuit of claim 7, wherein the digital BIST circuit comprises:
   a pull-up resistor connected to a power supply voltage;
   a pull-up switch configured to control an electric connection between the pull-up resistor and an output node of the second digital code;
   a pull-down resistor connected to a ground voltage; and
   a pull-down switch configured to control an electric connection between the pull-down resistor and the output node of the second digital code.

13. The temperature measurement circuit of claim 12, wherein the digital BIST circuit is configured to
   apply a first test signal having a higher voltage level than a voltage level corresponding to a maximum value of the second digital code to the analog-digital converter circuit when the pull-down switch is turned on,
   apply a second test signal having a lower voltage level than a voltage level corresponding to a minimum value of the second digital code to the analog-digital converter circuit when the pull-up switch is turned on, and
   generate a floating alarm signal indicating at least one of whether a first measured value of the second digital code is equal to the maximum value of the second digital code or whether a second measured value of the second digital code is equal to the minimum value of the second digital code.

14. The temperature measurement circuit of claim 7, wherein the analog-digital converter circuit comprises:
   a scan voltage generator circuit configured to generate a plurality of scan voltages having different voltage levels based on the measurement reference voltage and output the plurality of scan voltages one by one according to a unit scan time;
   a comparator circuit configured to generate a plurality of comparison result values by comparing the temperature-variant voltage with the plurality of scan voltages;
   a converter circuit configured to generate the second digital code based on the plurality of comparison result values; and
   a controller circuit configured to control the scan voltage generator circuit, the comparator circuit, and the converter circuit.

15. The temperature measurement circuit of claim 14, wherein the digital BIST circuit is configured to
   change the unit scan time between a first unit scan time and a second unit scan time longer than the first scan unit time, and
   generate a fluctuation alarm signal indicating whether a first measured value of the second digital code corresponding to the first unit scan time is equal to a second measured value of the second digital code corresponding to the second unit scan time.

16. The temperature measurement circuit of claim 14, wherein the digital BIST circuit comprises a counter configured to monitor operation timings of the analog-digital converter circuit, and wherein the digital BIST circuit is configured to generate at least one of a settling alarm signal or a conversion alarm signal using the counter,
   wherein the settling alarm signal indicates whether a total scan time for outputting the plurality of scan voltages from the scan voltage generator circuit is shorter than a first reference time, and
   wherein the conversion alarm signal indicates whether a conversion time for generating the second digital code by the converter circuit is shorter than a second reference time.

17. The temperature measurement circuit of claim 7, comprising:
   a main sensing unit disposed at a main position and configured to generate a main sensing voltage that varies depending on a main operation temperature at the main position; and
   a plurality of local sensing units disposed at a plurality of local positions and configured to generate a plurality of local sensing voltages that vary depending on local operation temperatures at the plurality of local positions.

18. The temperature measurement circuit of claim 17, wherein the digital BIST circuit is configured to
   receive a first measured value of the second digital code corresponding to the main sensing voltage and a second measured value of the second digital code corresponding to a local sensing voltage provided from a local sensing unit nearest to the main sensing unit among the plurality of local sensing units, and generate a probe-check alarm signal indicating whether a difference between the first measured value and the second measured value is smaller than a reference value.

19. A temperature measurement circuit comprising:
a temperature detection circuit comprising:
- an analog circuit configured to generate a measurement reference voltage that is fixed regardless of an operation temperature and a temperature-variant voltage that varies depending on the operation temperature; and
- an analog-digital converter circuit configured to generate a digital code indicating the operation temperature based on the measurement reference voltage and the temperature-variant voltage; and an analog built-in self-test (BIST) circuit configured to generate, for each of a plurality of voltages of the analog circuit, a respective flag signal indicating whether the voltage is within a respective predetermined range.

20. A built-in self-test (BIST) circuit configured to monitor a temperature detection circuit including an analog circuit and an analog-digital converter circuit, the BIST circuit comprising:

an analog BIST circuit configured to generate, for each of a plurality of monitoring voltages of the analog circuit, a respective flag signal indicating whether the monitoring voltage is within a respective predetermined range; and a digital BIST circuit configured to
- apply a test signal to the analog-digital converter circuit in a test mode, and
- based on a response of the analog-digital converter circuit to the test signal, an alarm signal indicating an operation state of the analog-digital converter circuit.

* * * * *